(12) United States Patent
Lee et al.

(10) Patent No.: US 11,855,143 B2
(45) Date of Patent: Dec. 26, 2023

(54) SEMICONDUCTOR STRUCTURES AND METHODS THEREOF

(71) Applicant: Taiwan Semiconductor Manufacturing Company, Ltd., Hsin-Chu (TW)

(72) Inventors: Wei Ju Lee, Hsinchu (TW); Chun-Fu Cheng, Hsinchu County (TW); Chung-Wei Wu, Hsin-Chu County (TW); Zhiqiang Wu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 94 days.

(21) Appl. No.: 17/187,458

(22) Filed: Feb. 26, 2021

(65) Prior Publication Data
US 2022/0278198 A1  Sep. 1, 2022

(51) Int. Cl.
*H01L 29/08* (2006.01)
*H01L 29/423* (2006.01)
*H01L 21/02* (2006.01)
*H01L 29/45* (2006.01)
*H01L 29/786* (2006.01)

(52) U.S. Cl.
CPC .... *H01L 29/0847* (2013.01); *H01L 21/02532* (2013.01); *H01L 21/02609* (2013.01); *H01L 29/42392* (2013.01); *H01L 29/456* (2013.01); *H01L 29/78696* (2013.01)

(58) Field of Classification Search
CPC ............... H01L 21/0214; H01L 21/022; H01L 29/7834; H01L 29/4966; H01L 29/785; H01L 29/512; H01L 21/02164; H01L 29/66795
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |

(Continued)

FOREIGN PATENT DOCUMENTS

EP  1555688 A2 *  7/2005 ....... H01L 29/66795

OTHER PUBLICATIONS

17187458_2023-01-31_EP_1555688_A2_M.pdf (Year: 2005).*

*Primary Examiner* — Brian Turner
(74) *Attorney, Agent, or Firm* — HAYNES AND BOONE, LLP

(57) ABSTRACT

In one example aspect, the present disclosure is directed to a device. The device includes an active region on a semiconductor substrate. The active region extends along a first direction. The device also includes a gate structure on the active region. The gate structure extends along a second direction that is perpendicular to the first direction. Moreover, the gate structure engages with a channel on the active region. The device further includes a source/drain feature on the active region and connected to the channel. A projection of the source/drain feature onto the semiconductor substrate resembles a hexagon.

20 Claims, 17 Drawing Sheets

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2014/0001441 A1* | 1/2014 | Kim | H01L 21/31155 |
| | | | 257/29 |
| 2014/0117455 A1* | 5/2014 | Liu | H01L 21/764 |
| | | | 257/E21.409 |
| 2015/0221654 A1* | 8/2015 | Kim | H01L 21/0262 |
| | | | 257/77 |
| 2015/0303118 A1* | 10/2015 | Wang | H01L 29/7853 |
| | | | 257/401 |
| 2016/0315081 A1* | 10/2016 | Park | H01L 29/41791 |
| 2017/0352759 A1* | 12/2017 | Kim | H01L 29/165 |
| 2019/0006469 A1* | 1/2019 | Kim | H01L 29/0847 |
| 2019/0164966 A1* | 5/2019 | Wang | H01L 27/0922 |
| 2019/0393347 A1* | 12/2019 | Kim | H01L 29/66545 |
| 2020/0235227 A1* | 7/2020 | Chang | H01L 21/0214 |

* cited by examiner

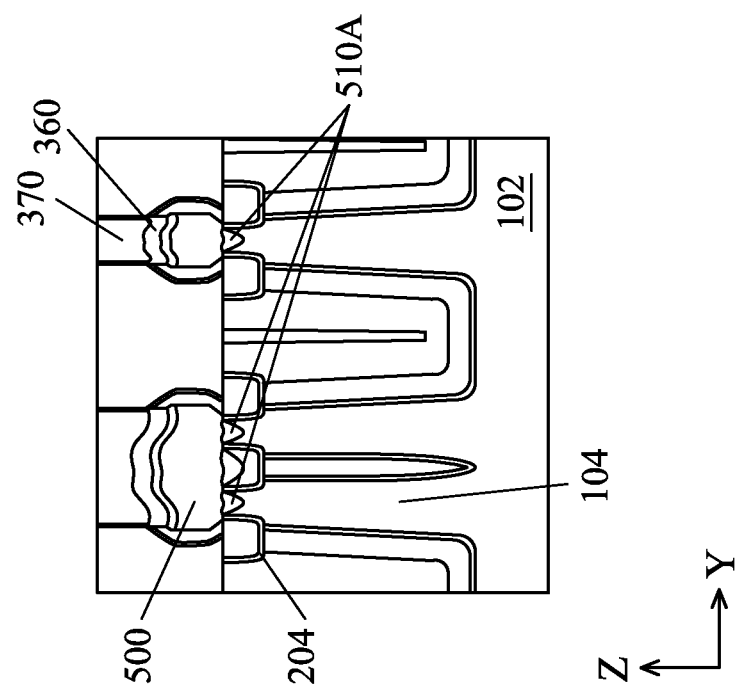
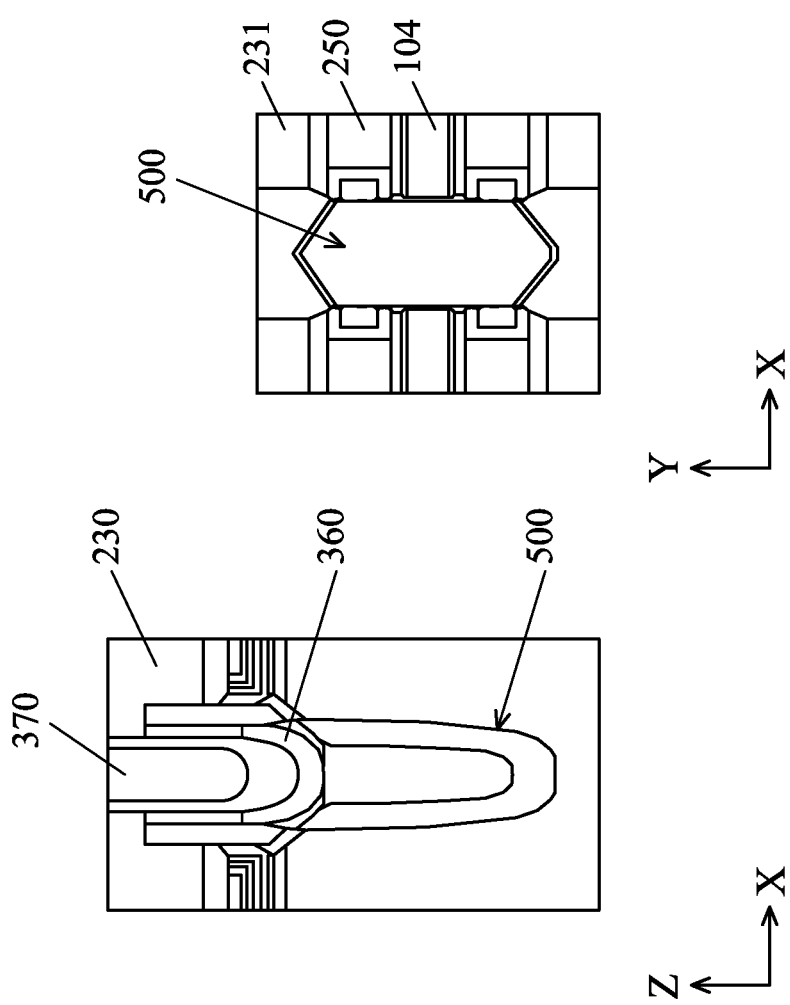
FIG. 2A  FIG. 2B  FIG. 2C

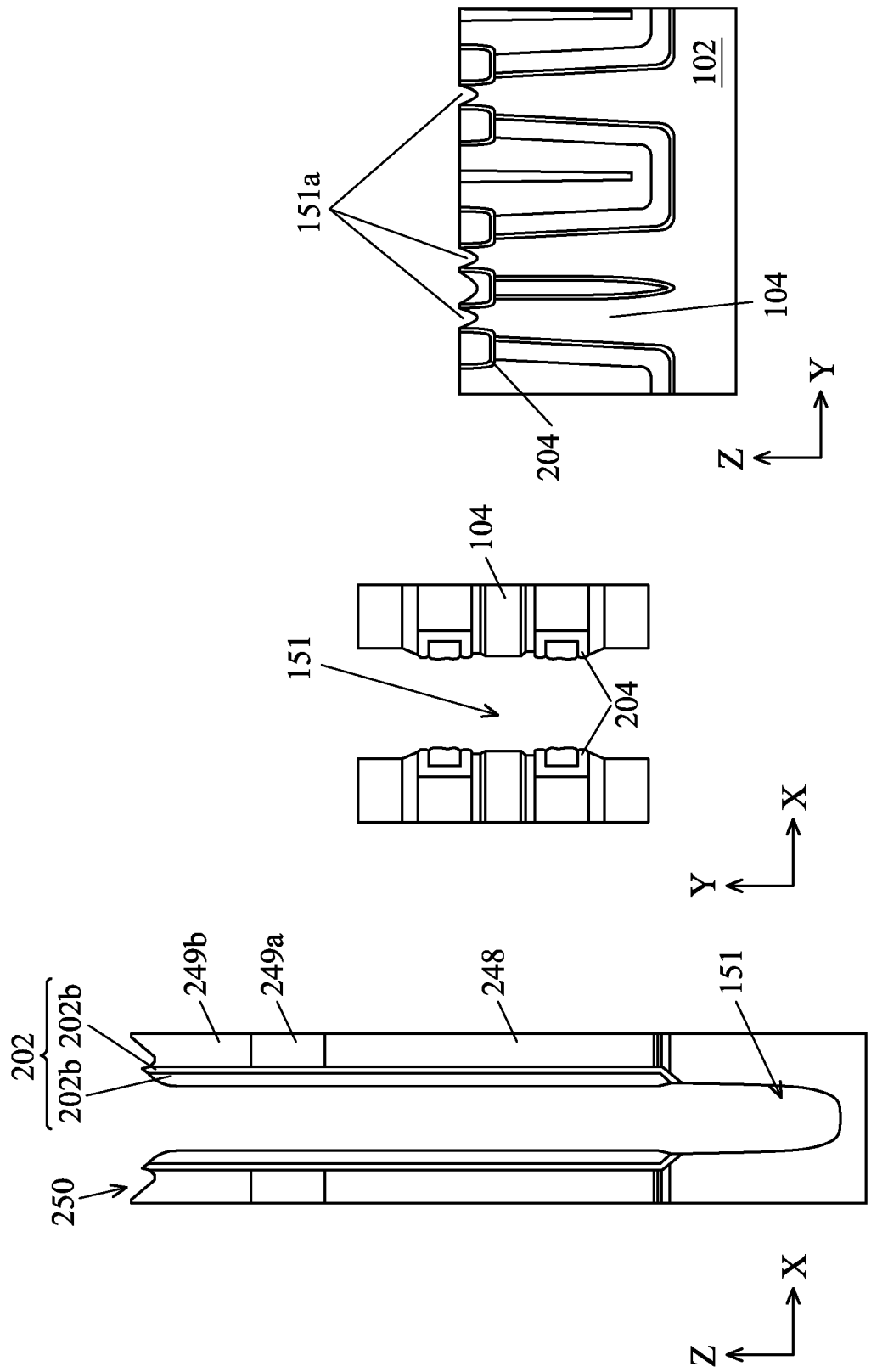

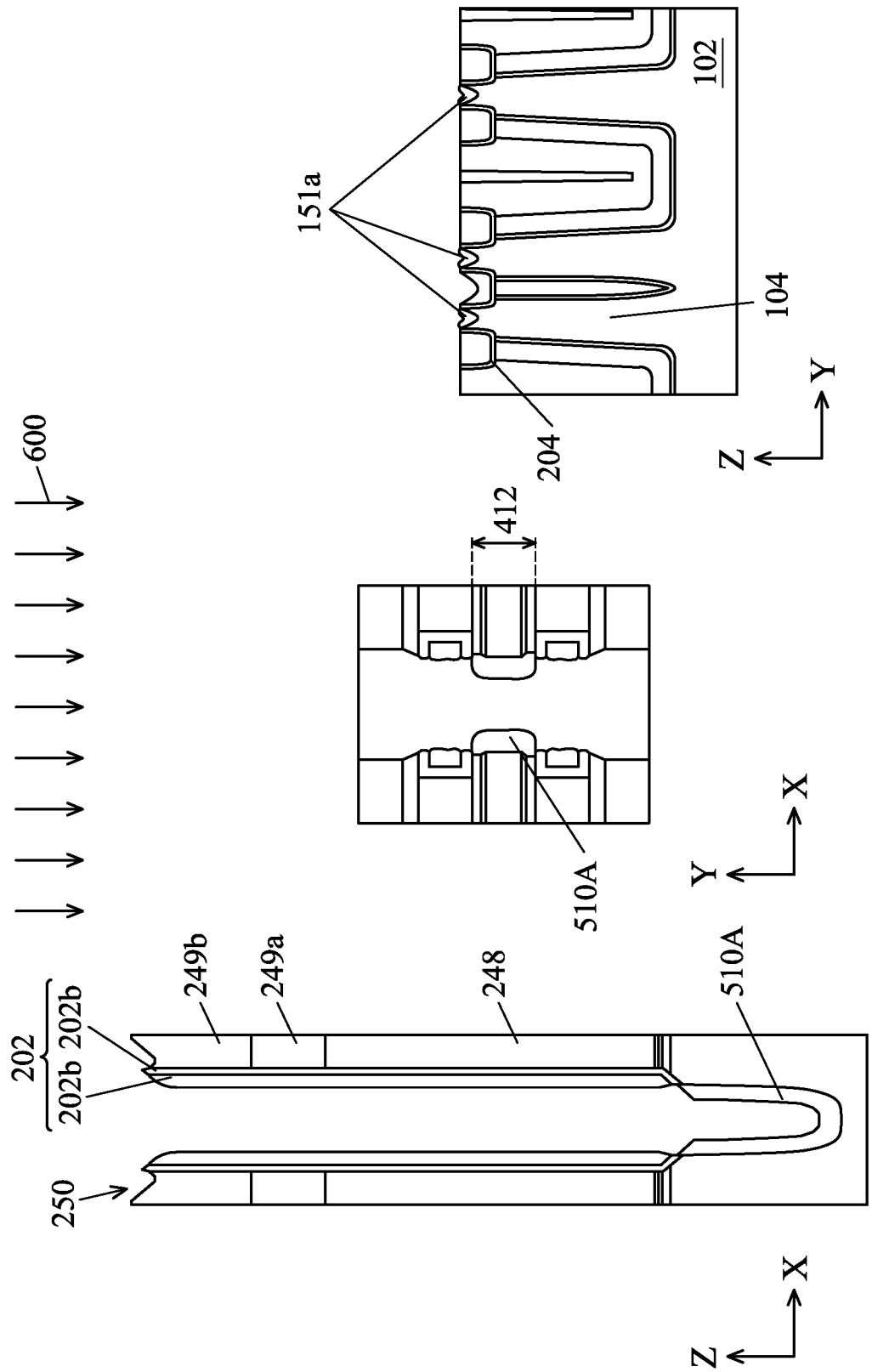

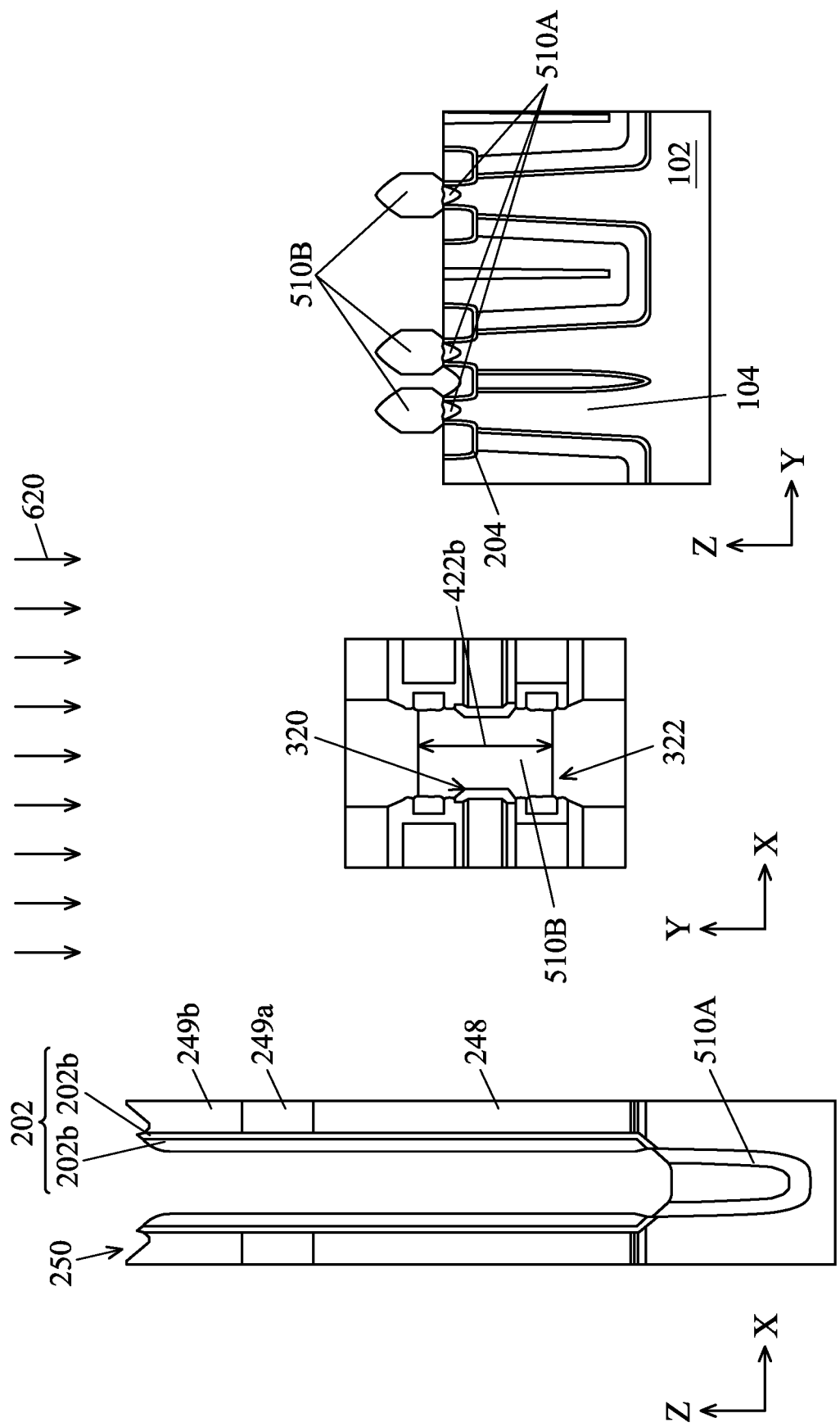

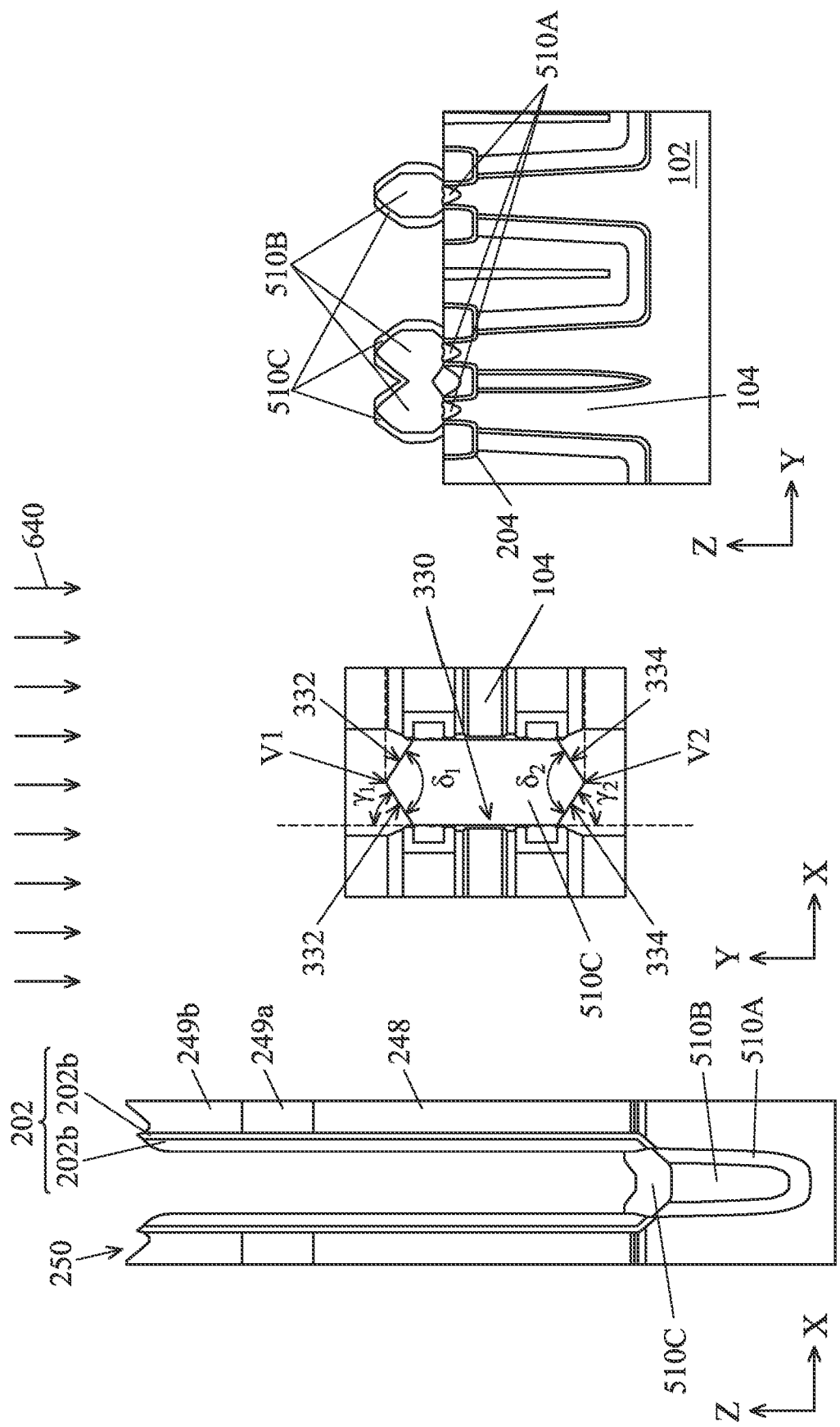

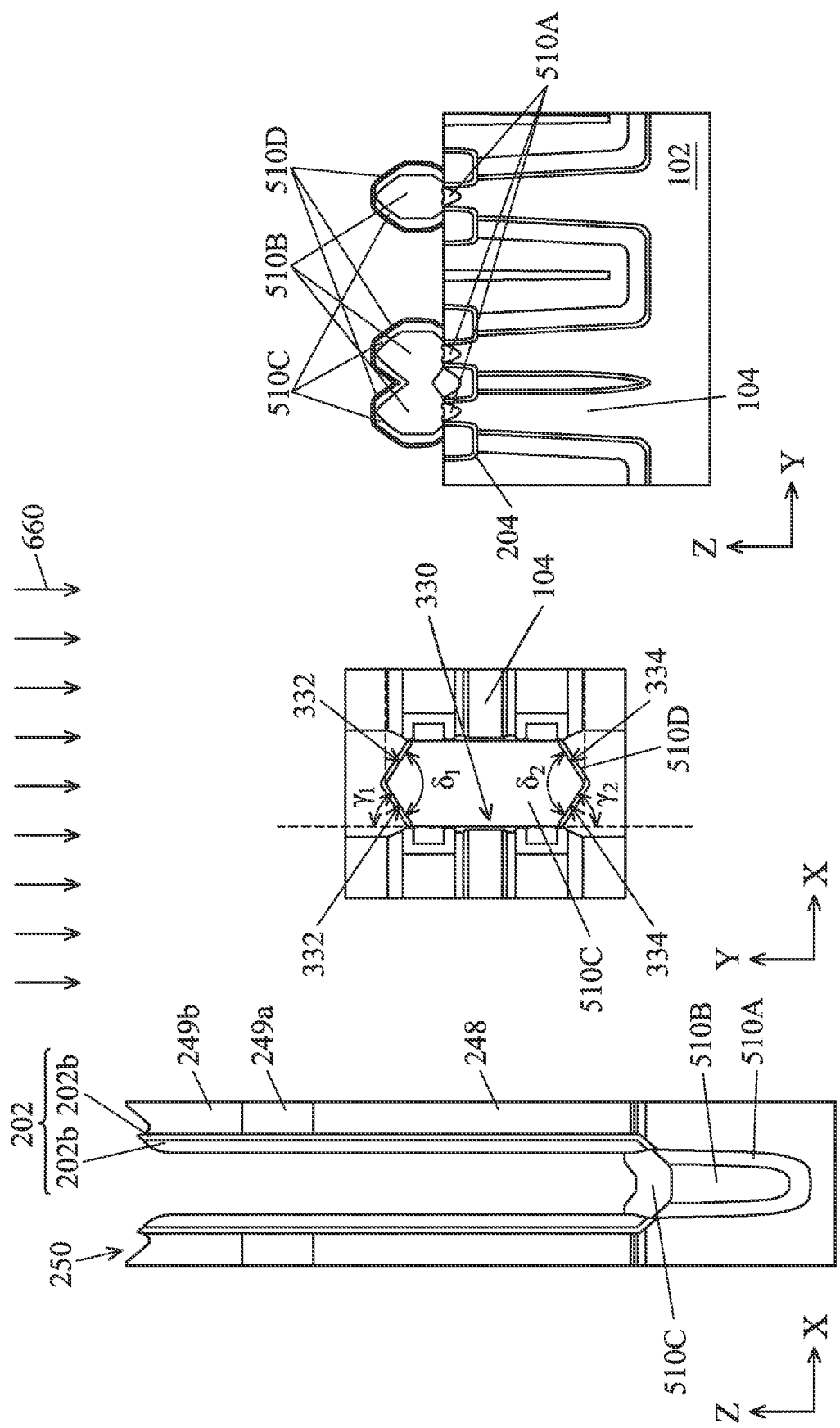

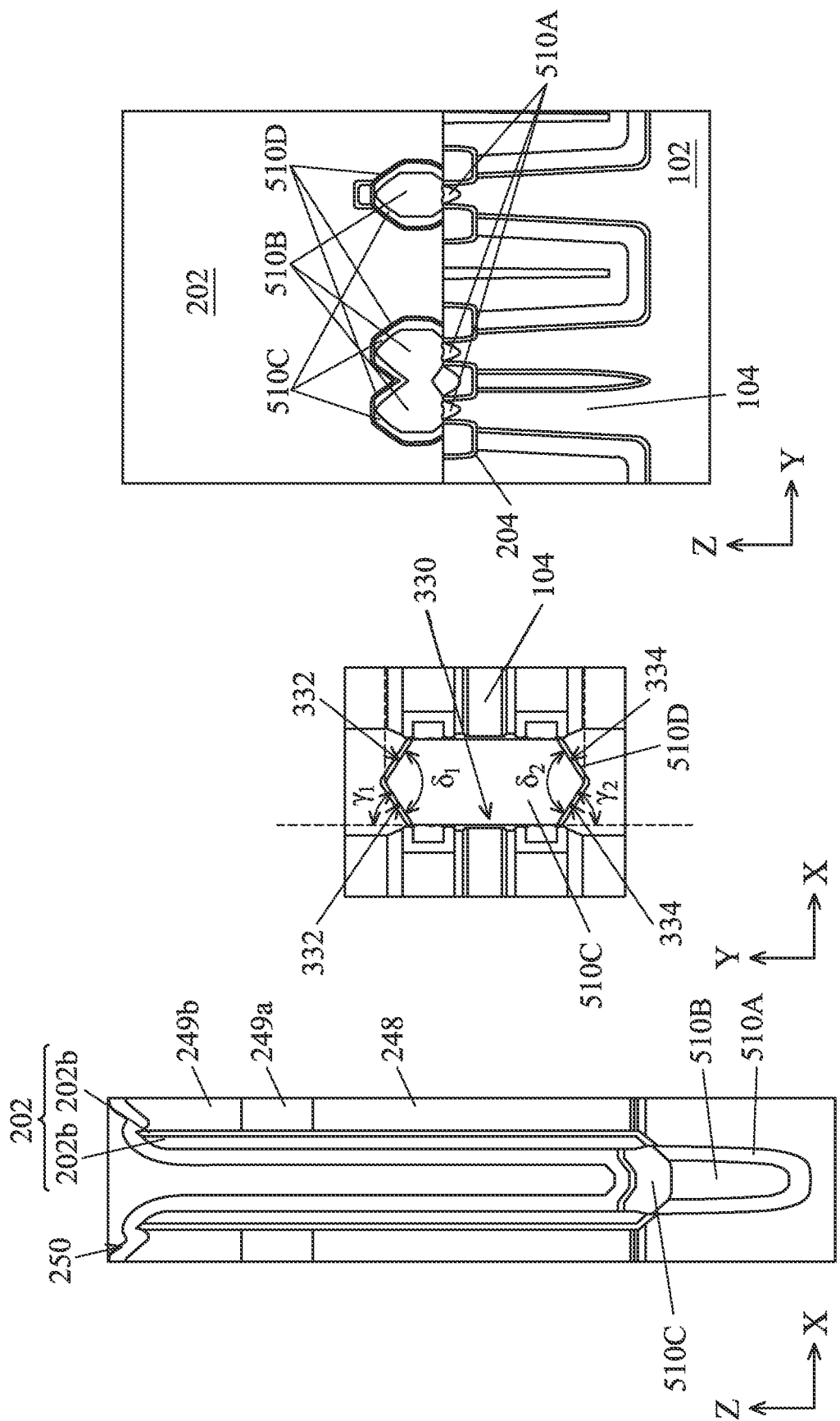

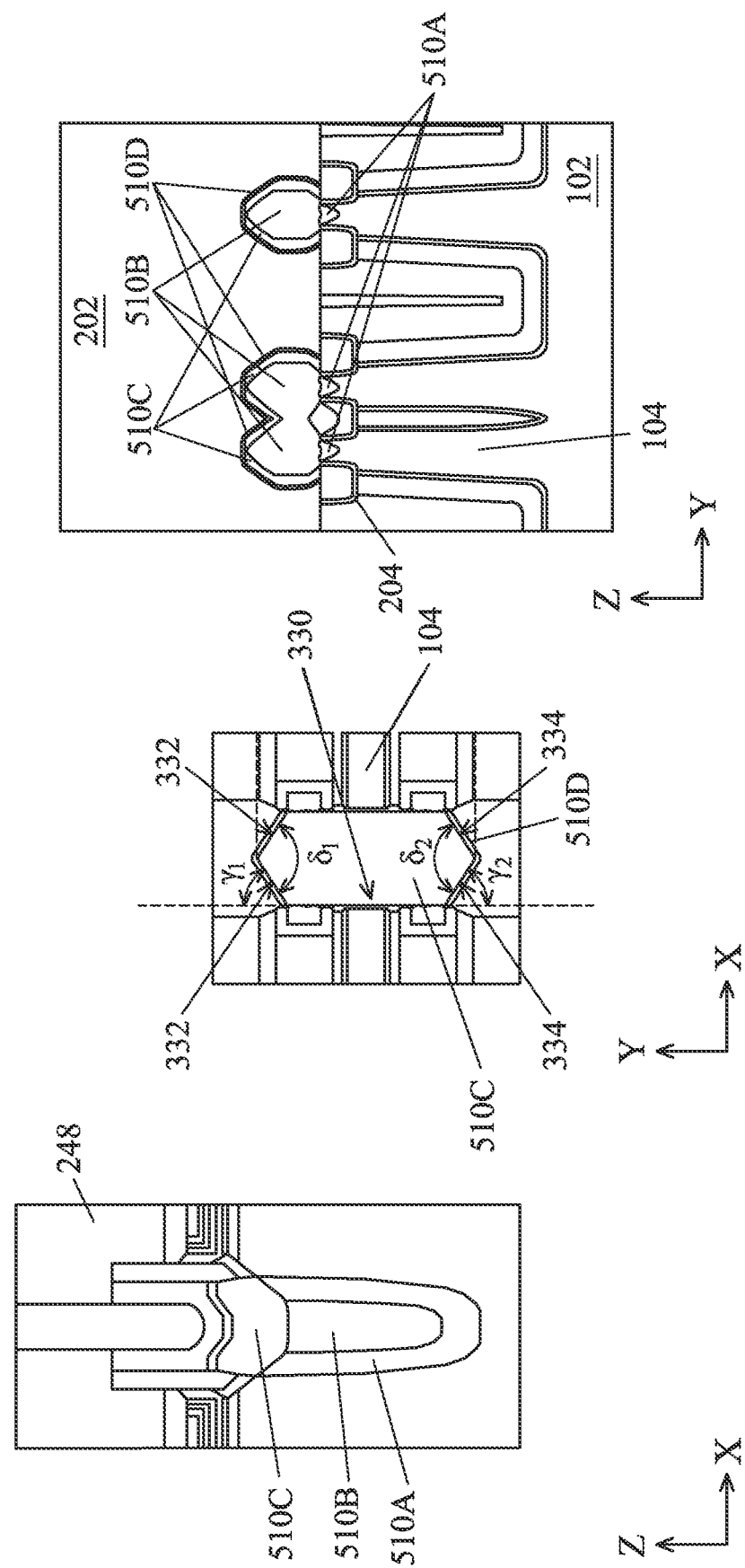

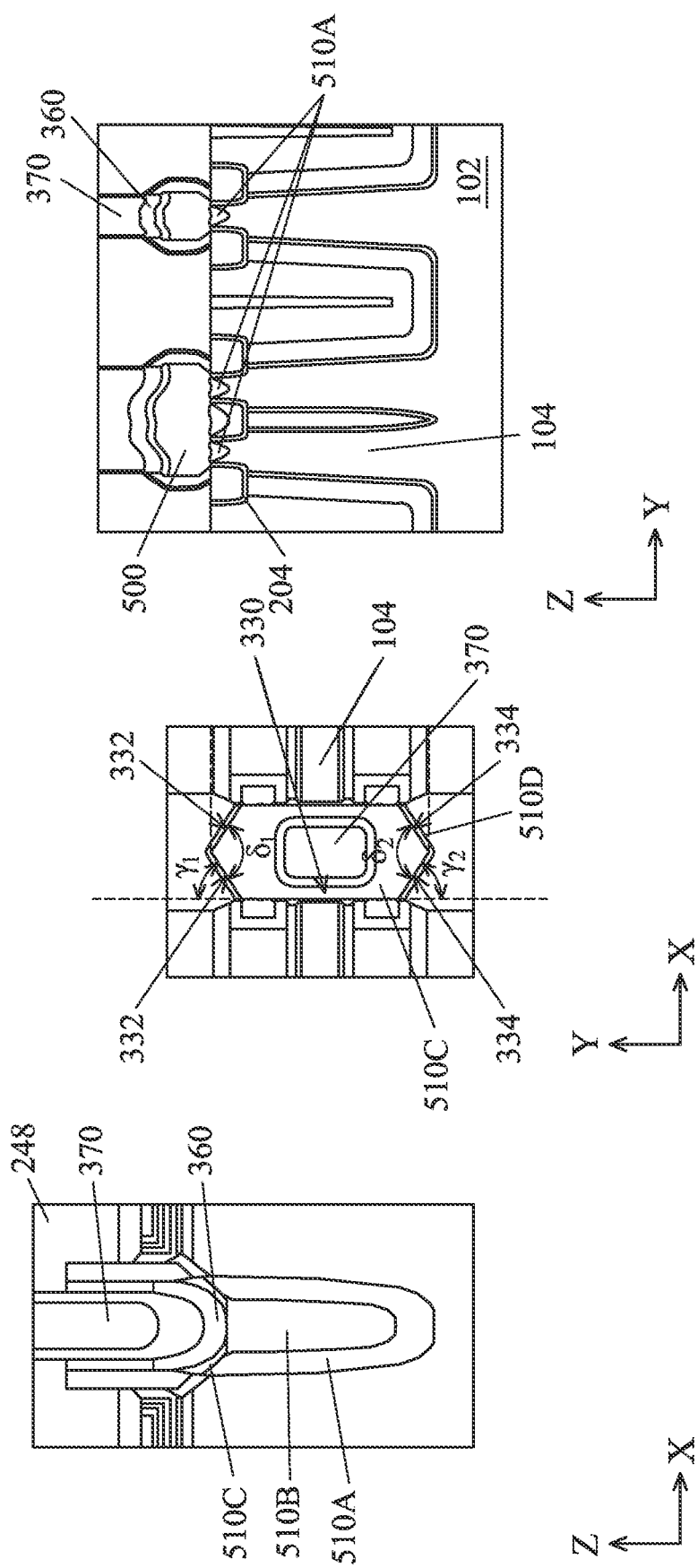

SEMICONDUCTOR STRUCTURES AND METHODS THEREOF

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs.

Such scaling has also increased complexity of the IC manufacturing processes. Thus, realizing continued advances in IC devices and their performance requires similar advances in IC manufacturing processes and technology. For example, as the feature sizes reduce, the contact surface area between two connected conductors continues to shrink, which results in high contact resistances. Such high contact resistances may negate any improvement in performance due to the reduced node size. Accordingly, although existing technologies are generally adequate for their intended purposes, they are not satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, and 2C are diagrammatic cross-sectional views of the semiconductor device of FIG. 1 along the A-A, B-B, and C-C lines, respectively, in entirety or in portions, according to an embodiment of the present disclosure.

FIGS. 4A, 5A, 6A, 7A, 8A, 9A, 10A, 11A, and 12A are diagrammatic cross-sectional views of the semiconductor device of FIG. 1 along the A-A line of FIG. 1, in entirety or in portions, at various fabrication stages according to an embodiment of the present disclosure.

FIGS. 4B, 5B, 6B, 7B, 8B, 9B, 10B, 11B, and 12B are diagrammatic cross-sectional views of the semiconductor device of FIG. 1 along the B-B line of FIG. 1, in entirety or in portions, at various fabrication stages according to an embodiment of the present disclosure.

FIGS. 4C, 5C, 6C, 7C, 8C, 9C, 10C, 11C, and 12C are diagrammatic cross-sectional views of the semiconductor device of FIG. 1 along the C-C line of FIG. 1, in entirety or in portions, at various fabrication stages according to an embodiment of the present disclosure.

DETAILED DESCRIPTION

Figure 1:
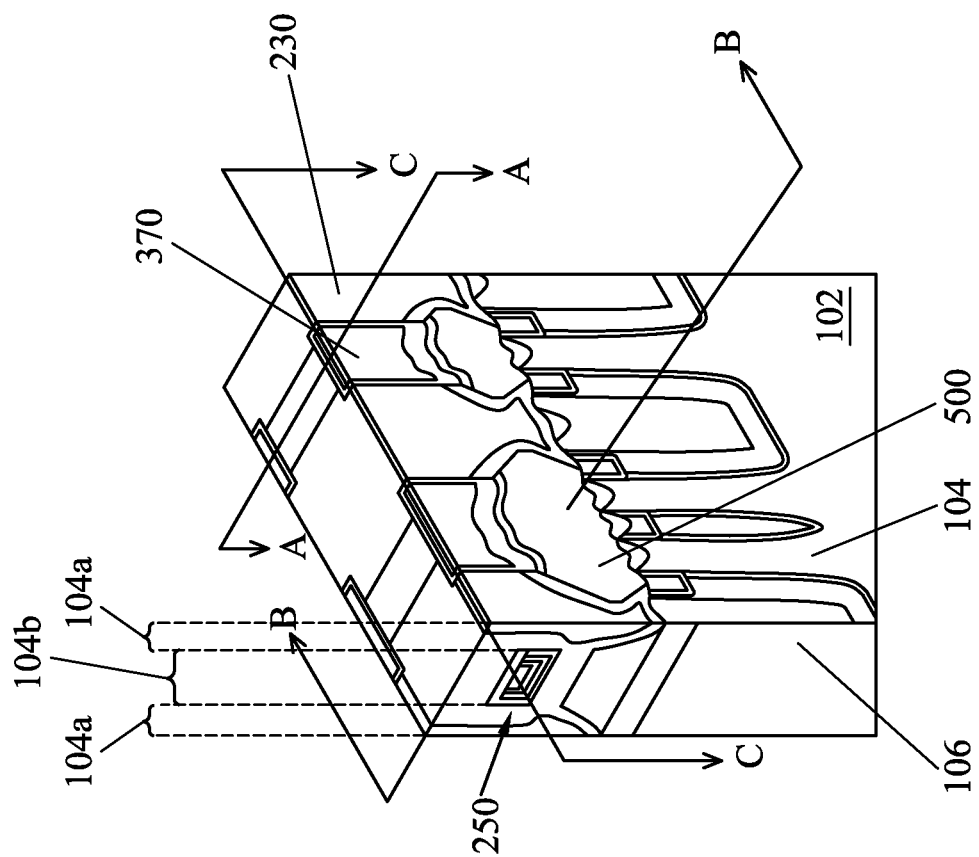
FIG. 1 is a three-dimensional (3D) perspective view of an embodiment of a semiconductor device of the present disclosure constructed according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure relates generally to semiconductor devices such as integrated circuits (IC), and more particularly, to source/drain (S/D) features of semiconductor devices. Source/drain features are typically connected to voltages using local contact features (or local contacts) that land on the top surfaces of the source/drain features. As the feature dimensions shrink as the down-scaling continues, the contact surface areas between the source/drain features and the local contact features also shrink, leading to increased contact resistances. Such increase has been shown to adversely affect the performances of the devices, sometimes negating large part of the performance gain from the down-scaling. In some approaches addressing such issues, the size of the source/drain features are increased. However, devices formed using such approaches sometimes suffer reduced uniformity control of critical dimensions. For example, source/drain features formed in different areas and/or in different local environments may have dissimilar lateral dimensions. This contributes to reduced reliability and/or compromised overall performance of the device. Accordingly, it is desirable to increase the contact surface area between the source/drain features and the local contacts, without losing the uniformity control over the critical dimension. This present disclosure provides a method to achieve such by engineer the profiles of the source/drain features.

The semiconductor device described herein may be an intermediate device fabricated during the processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, the disclosure below uses three-dimensional FinFET devices as an example. However, the disclosure further contemplates the same methods and/or structures being applied to planar FET devices, to multi-gate devices (such as gate-all-around devices, multi-bridged channel devices), and to other similar devices.

FIG. 1 is a three-dimensional (3D) perspective view of an example semiconductor device 100 (or device 100) of the present disclosure constructed according to some embodiments of the present disclosure. FIGS. 2A, 2B, and 2C are diagrammatic cross-sectional views of the semiconductor device of FIG. 1 along the A-A, B-B, and C-C lines, respectively, in entirety or in portions, according to an embodiment of the present disclosure. As illustrated, the device 100 includes a semiconductor substrate 102 (or substrate 102). Fin structures (or fins) 104 are formed over the substrate 102, each extending lengthwise horizontally in an x-direction and separated from each other horizontally in a y-direction. The x-direction and the y-direction are perpendicular to each other, and the z-direction is orthogonal (or normal) to a horizontal x-y plane defined by the x-direction and the y-direction. The substrate 102 may have its top surface parallel to the x-y plane.

The fin structures 104 each have a source region 104a and a drain region 104a disposed along the x-direction. The source region 104a and the drain region 104a are collectively referred to as the source/drain regions 104a. Epitaxial source/drain features 500 are formed in or on the source/drain regions 104a of the fin structure 104. In some embodiments, the epitaxial source/drain features 500 may merge together, for example, along the y-direction between adjacent fin structures 104 to provide a larger lateral width than an individual epitaxial source/drain feature. The fin structures 104 each further have a channel region 104b disposed between and connecting the source/drain regions 104a. The portion of the fin structure in the channel region 104b (or simply the channel 104b) connects the epitaxial source/drain features 500. The channel 104b engages with a contiguous gate structure 250 that extends substantially orthogonal to the lengthwise direction of the fin structures 104, such as along the y-direction. The device 100 further includes isolation features 106 within or over the substrate 102, separating adjacent fin structures 104 from each other. FIGS. 1, and 2A-2C have been abbreviated to provide a general understanding of the device 100, and do not include all details. Additional details of the various features are described in conjunction with subsequent figures.

Figure 3:
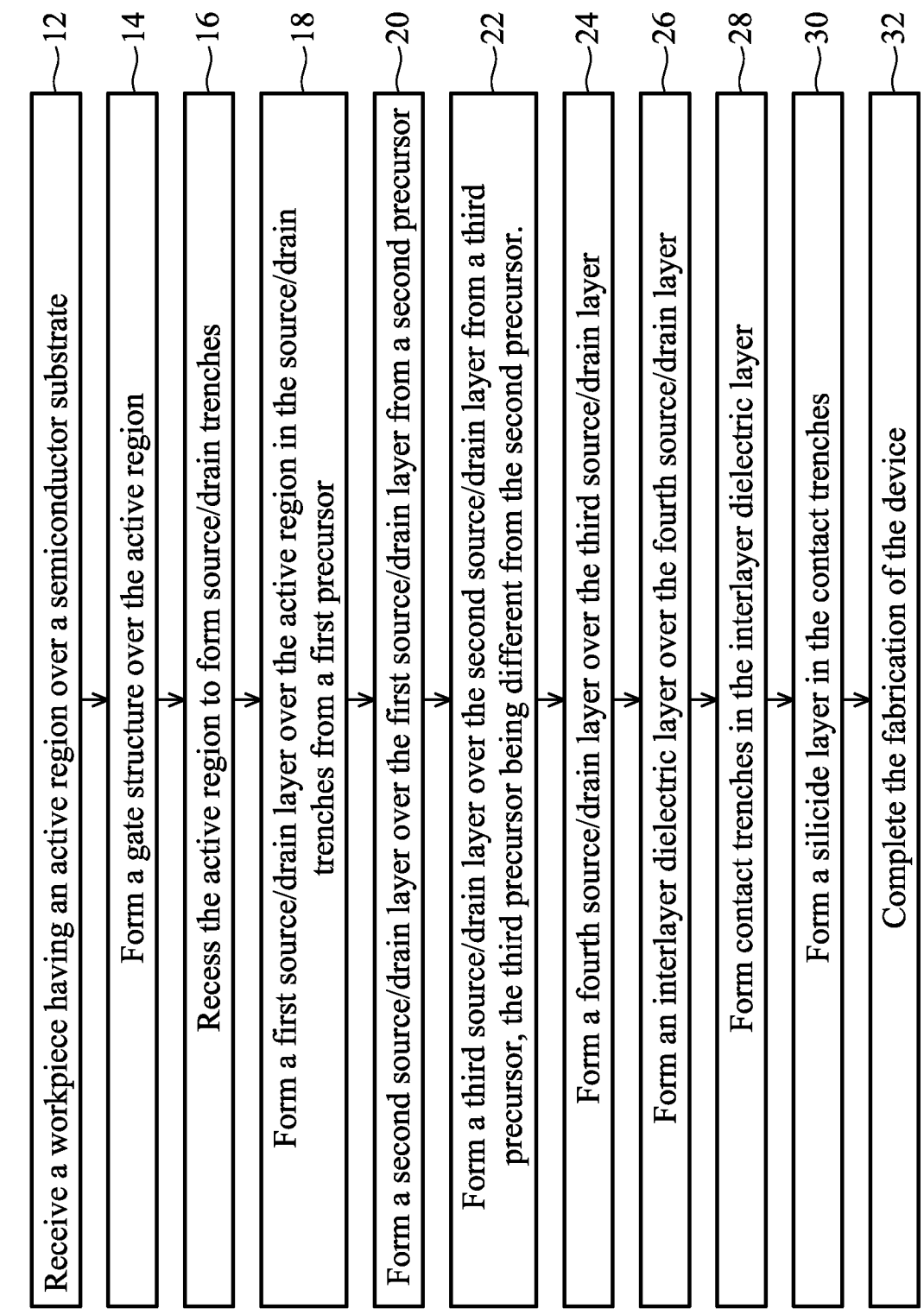
FIG. 3 is a flow chart of an embodiment of the methods for fabricating a semiconductor device according to various aspects of the present disclosure.

FIG. 3 is a flow chart of an embodiment of methods for fabricating a semiconductor device according to various aspects of the present disclosure. In some embodiments, the method 10 fabricates a semiconductor device 100. Additional processing is contemplated by the present disclosure. Additional steps can be provided before, during, and after the method 10, and some of the steps described below can be moved, replaced, or eliminated for additional embodiments of the method 10. The method 10 is described below in conjunction with FIGS. 4A-12A, 4B-12B, 4C-12C, and 7D-12D. FIGS. 4A-12A, 4B-12B, and 4C-12C are diagrammatic cross-sectional views of the semiconductor device of FIG. 1 along the A-A, B-B, and C-C lines of FIG. 1, respectively, in entirety or in portions, at various fabrication stages according to an embodiment of the present disclosure. FIGS. 7D-12D are expanded diagrammatic cross-sectional views of a portion of the semiconductor device of FIG. 1 along the C-C line of FIG. 1, at various fabrication stages according to an embodiment of the present disclosure. FIGS. 4A-12A, 4B-12B, 4C-12C, and 7D-12D have been simplified for the sake of clarity to better understand the inventive concepts of the present disclosure. For example, certain features off the respective cross-section plane (such as the cross-section planes A-A, B-B, C-C, respectively) are omitted. Additional features can be added in the device 100, and some of the features described below can be replaced, modified, or eliminated in other embodiments of the device 100. The fabrication of the device 100 is described below in conjunction with embodiments of the method 10.

Figures 4A, 4B, 4C:
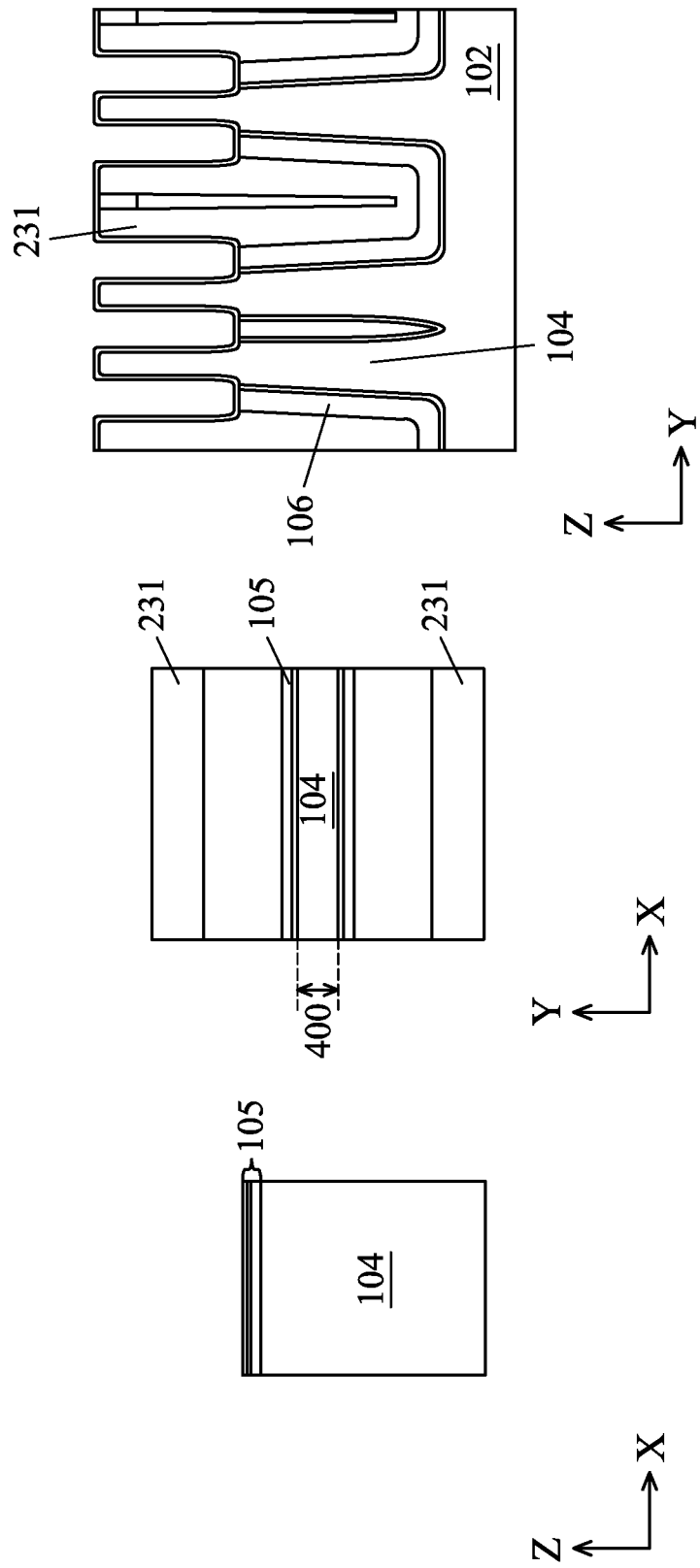

Referring to block 12 of FIG. 3 and to FIGS. 4A-4C, an initial structure of the device 100 (or workpiece 100) is received. The initial structure includes a substrate 102. The substrate 102 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for device manufacturing. In one example, the substrate 102 may be a silicon-on-insulator (SOI) substrate having a semiconductor silicon layer formed on a silicon oxide layer. In another example, the substrate 102 may include a conductive layer, a semiconductor layer, a dielectric layer, other layers, or combinations thereof. As indicated above, various doped regions may be formed in or on the substrate 102. The doped regions may be doped with n-type dopants, such as phosphorus or arsenic, and/or p-type dopants, such as boron or indium, depending on design requirements. The doped regions may be formed directly on the substrate 102, in a p-well structure, in an n-well structure, in a dual-well structure, or using a raised structure. Doped regions may be formed by implantation of dopant atoms, in-situ doped epitaxial growth, and/or other suitable techniques.

The initial structure of the device 100 also includes active regions 104. In the depicted embodiments, the active regions 104 are elongated fin-like structures that protrude upwardly out of the substrate 102 (for example, along the z-direction). As such, the active regions 104 may be interchangeably referred to as fins 104 or fin structures 104 hereinafter. The fin structures 104 are oriented lengthwise along the x-direction. The fin structures 104 may be fabricated using suitable processes including photolithography and etch processes. The photolithography process may include forming a photoresist layer overlying the substrate 102, exposing the photoresist to a pattern, performing post-exposure bake processes, and developing the photoresist to form a masking element (not shown) including the resist. The masking element is then used for etching recesses into the substrate 102, leaving the fin structures 104 on the substrate 102. The etching process may include dry etching, wet etching, reactive ion etching (RIE), and/or other suitable processes. In some embodiments, the fin structure 104 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 104. In some embodiments, the device 100 includes one or more layers (such as layers 105) over the fin structures 104. These layers protect the fin structures 104 from subsequent processing operations. The fin structures 104 each have a width dimension 400 along the y-direction. In some embodiments, the width dimension 400 is about 3 nm to about 50 nm, such as about 5 nm to about 9 nm.

The initial structure of the device 100 further includes the isolation features 106. The isolation features 106 electrically separate various components of the device 100. The isolation features 106 may include silicon oxide, silicon nitride, silicon oxynitride, fluoride-doped silicate glass (FSG), a low-k dielectric material, and/or other suitable materials. In some embodiments, the isolation features 106 may include shallow trench isolation (STI) features. In one embodiment, the isolation features 106 are formed by etching trenches in the substrate 102 during the formation of the fin structures 104. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation features 106. Alternatively, the isolation features 106 may include a multi-layer structure, for example, having one or more thermal oxide liner layers. In the depicted embodiments, the fin structures 104 each extend above the top surface of the isolation features 106.

In various embodiments, the device 100 may also include one or more hybrid fins 231 extending in parallel to the fin structures 104. In some examples, the hybrid fins 231 may be formed after the fin structures 104. In some embodiments, the isolation features 106 interposing the fin structures 104 may be patterned (e.g., using a photolithography and etching process) to form trenches within the isolation features 106 and within which the hybrid fins 231 are formed. Alternatively, the dielectric material used to form the isolation features 106 may be deposited conformally over the fin structures 104, such that the conformal deposition itself forms trenches within the isolation features 106 and between adjacent fin structures 104, within which the hybrid fins 231 are formed. Regardless of how they are formed, the trenches within the isolation features 106 may be filled with one or more isolation materials to form the hybrid fins 231. In some cases, the isolation material used to form the hybrid fins 231 may include a layer of a low-k (LK) material including SiCN, SiOC, SiOCN, or another low-k material (e.g., with a dielectric constant 'k'<7), a layer of a high-k (HK) material including $HfO_2$, $ZrO_2$, $HfAlO_x$, $HfSiO_x$, $Al_2O_3$, or another high-k material (e.g., with a dielectric constant 'k'>7), or a combination thereof. In some embodiments, the isolation material used to form the hybrid fins 231 may include a first layer and a second layer formed over the first layer, where the first layer includes a LK material (such as a LK material noted above), and where the second layer includes a HK material (such as a HK material noted above). Thus, in some cases, the hybrid fins 231 may include a bi-layer dielectric material, where an upper layer of the hybrid fin 231 is HK and where a lower layer of the hybrid fin 231 is LK. Alternatively, in some cases, the upper layer of the hybrid fins 231 may be LK and the lower layer of the hybrid fins 231 may be HK. In some embodiments, hybrid fins 231 may serve to define the maximal lateral widths (along the y-direction) of subsequently formed source/drain features.

Referring to block 14 of FIG. 3 and to FIGS. 5A-5C, gate structures 250 are formed over the fin structure 104. In some embodiments, the gate structures 250 may be formed along the y-direction and perpendicular to the lengthwise direction of the fin structures 104. In other words, the gate structures 250 are formed in a y-z plane. In some embodiments, the gate structures 250 are also formed over the isolation features 106 in between adjacent fin structures 104. In some embodiments, the gate structures 250 each wrap around the top surface and sidewall surfaces of each of the fin structures 104. The gate structures 250 may each include a gate stack 248. In some embodiments, the gate stack 248 includes an oxide gate dielectric and a polysilicon gate electrode. In some embodiments, the gate stacks 248 are high-k metal gate (HKMG) stacks that contain a high-k gate dielectric and a metal gate electrode. In some embodiments, the gate structures 250 includes a polysilicon gate stack (referred to as the dummy gate stack) at this processing stage which is later replaced with a HKMG stack. In some embodiments, the gate stack 248 also include one or more mask layers (such as the mask layers 249a and/or 249b), which are used to pattern the gate stacks 248. The gate structures 250 may be formed by a procedure including deposition, lithography, patterning, and etching processes. The deposition processes may include CVD, ALD, PVD, other suitable methods, and/or combinations thereof.

Gate spacers 202 are formed on sidewall surfaces of the gate stacks 248. In some embodiments, the gate spacers 202 may be formed by depositing a dielectric material over the gate stacks 248, followed by an anisotropic etching process to remove portions of the dielectric material from the top surfaces of the gate stacks 248. After the etching process, portions of the dielectric material on the sidewall surfaces of the gate stacks 248 substantially remain and become the gate spacers 202. In some embodiments, the anisotropic etching process is a dry (e.g. plasma) etching process. Additionally or alternatively, the formation of the gate spacers 202 may also involve chemical oxidation, thermal oxidation, ALD, CVD, and/or other suitable methods. The gate spacers 202 may include a single layer or a multi-layer structure. For example, in the depicted embodiment, a gate spacer layer 202a is formed over the top surface of the device, and a gate spacer layer 202b is formed over the gate spacer layer 202a. The gate spacers 202 may each include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In some embodiments, the gate spacers 202 may collectively has a thickness in the range of a few nanometers (nm).

In some embodiments, the dielectric material that forms the gate spacers 202 is also deposited over and on sidewall surfaces of the fin structures 104, for example, in the same deposition operation. The dielectric material on top surfaces of the fin structures 104 is then removed. Accordingly, the dielectric material on sidewall surfaces of the fin structures 104 substantially remains and becomes the fin sidewall spacers 204. In some embodiments, the heights of the fin sidewall spacers 204 are adjusted. For example, dopants may be introduced (for example, by an implantation operation) into top portions of the dielectric material above a desired height level. A selective etching operation is then conducted to remove the top portions of the dielectric material. The remaining portions that remains as the fin sidewall spacers 204 therefore has the desired height. Sometimes, such etching process may introduce variations in the heights of the fin sidewall spacers 204 unintentionally due to processing variations and/or various factors, such as the locations and the local environments of the fin sidewall spacers 204. As described in detail later, source/drain layers are formed over the fin sidewall spacers 204. In other words, the top surfaces of the fin sidewall spacers 204 define a starting point for the growth of source/drain features. Accordingly, the variation in the height of the fin sidewall spacers 204, either intentionally or unintentionally, impacts the profile of the source/drain features subsequently formed thereon. As a result, in some approaches not implementing the present disclosure, the critical dimensions for source/drain features in different locations and/or with different local environments may have substantially dissimilar critical dimensions, such that the uniformity control is compromised. By contrast, as described in detail below, embodiments of the present disclosure minimize such impacts thereby improves the uniformity control, Referring to block 16 of FIG. 3 and still referring to FIGS. 5A-5C, portions of the fin structures 104 exposed by the gate stacks 248 (e.g. in the source/drain regions 104b) are partially recessed (or etched away) to form the source/drain trenches 151 for subsequent epitaxial source and drain growths. Meanwhile, the portions underneath the gate stacks 248 remain intact. The etching operation may be any suitable etching operations, and may implement multiple lithography and etching steps, such as dry etchings and/or wet etchings. In some embodiments, the gate spacers 202 may be used as the mask element for the etching operation. The depth of the source/drain trenches 151 may be controlled by controlling an etching time duration. In some embodiments, the source/drain trenches 151 includes a bottom portion 151a below a top surface of the fin sidewall spacers 204. For example, the etching operation forms a concaved top surface for the etched fin structures 104. Accordingly, recesses 151a is formed embedded between adjacent fin sidewall spacers 204.

Referring to FIGS. 6A-6D, 7A-7D, and 8A-8D, the method 10 then proceeds to form the source/drain features 500. The source/drain features 500 include multiple layers, such as the source/drain layers 510A, 510B, 510C, and 510D. Each of these source/drain layers may be formed by performing an epitaxial growth process from top surfaces of a substrate semiconductor material. Accordingly, the source/drain features 500 may be interchangeably referred to as epitaxial features 500 and/or epitaxial source/drain features 500. Similarly, the source/drain layers 510A-510D may be interchangeably referred to as the epitaxial layers 510A-510D and/or the epitaxial source/drain layers 510A-510D. The source/drain layer 510A may be formed from an exposed top surface of the fin structures 104; the source/drain layer 510B may be formed from the top surface of the source/drain layer 510A; the source/drain layer 510C may be formed from the top surface of the source/drain layer 510B; and the source/drain layer 510D may be formed from the top surface of the source/drain layer 510C.

The epitaxial growth process may include performing an epitaxial deposition/partial etch process and repeating the epitaxial deposition/partial etch process. Accordingly, the epitaxial growth process is a cyclic deposition/etch (CDE) process. Details of the CDE process has been described in U.S. Pat. No. 8,900,958 titled "Epitaxial formation mechanisms of source and drain regions" by Tsai and Liu, which is herein incorporated in its entirety for reference. Briefly, the deposition operation of the epitaxial growth process may implement gaseous or liquid precursors. The precursors may interact with the semiconductor materials of the substrate 102, thereby forming a semiconductor epitaxy. In some embodiments, the deposition operation may use chemical vapor deposition (CVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. Then, an etching operation (such as a dry etching operation utilizing a halogen-based etching chemical) is conducted to remove amorphous semiconductor materials from the surface of the semiconductor epitaxy. In some embodiments, the etching operation also removes portions of the semiconductor epitaxy that include dislocations or other defects. Subsequently, another deposition operation is conducted to further grow and increase the thickness of the semiconductor epitaxy. The parameters of the etching and deposition operations (such as temperatures, duration, and etching chemical compositions) may be adjusted based on the desired feature profile, dimensions, or other characteristics. The cyclic process is repeated until a desired thickness of the epitaxial layer is reached. In some embodiments, the epitaxial growth process may instead be a selective epitaxial growth (SEG) process. The selective epitaxial growth process utilizes simultaneous deposition and etch operations. In some embodiments, the epitaxial growth process may include both CDE operations and SEG operations.

In the depicted embodiments, the device 100 is configured as an n-type device. Accordingly, the source/drain features 500 and the source/drain layers 510A, 510B, and 510C each include an n-type semiconductor material, such as silicon. Therefore, the epitaxial growth process may implement at least one silicon-containing precursor, such as silanes ($SiH_4$), disilanes ($Si_2H_6$), dichlorosilane ($SiH_2Cl_2$), other suitable silicon-containing precursors, or combinations thereof. Furthermore, the epitaxial layers 500 includes a suitable dopant element, such as phosphorous (P), arsenic (As), other suitable n-type dopant elements or combinations thereof. Accordingly, the epitaxial growth process may further implement a precursor including the P and/or As elements, such as phosphine ($PH_3$) and/or arsine ($AsH_3$). In some embodiments, the epitaxial growth process is conducted at a temperature that is about 400° C. to about 700° C. In some embodiments, the epitaxial growth process may additionally implement a carrier gas that includes nitrogen ($N_2$), hydrogen ($H_2$), hydrochloride (HCl), other suitable gas components, or combinations thereof.

While the formation of the source/drain layers 510A, 510B, and 510C are generally similar, they may each be designed to produce different profiles that collectively lead to certain designed morphologies for the overall source/drain feature 500. As described later, such designed morphology contributes to the reduction of contact resistances and/or improved critical dimension uniformity, and ultimately leads to improved device performances. These specific profiles may be achieved by, for example, regulating relative growth rates of different growth fronts of the epitaxial material. Generally, the growth of the epitaxial materials is anisotropic in nature. In other words, the epitaxial growth may proceed simultaneously on multiple growth fronts, each along a specific direction. The relative growth rates substantially determine the profile of the formed source/drain layer. In the depicted embodiments, the source/drain feature 500 (and layers thereof) includes single crystal silicon. Moreover, the device 100 is configured to have a silicon <100> facet facing upwards along the z-direction, and silicon <110> facets facing along the x-direction and the y-direction. Accordingly, where it is desirable to form tall and narrow features, the epitaxial process may implement precursors and parameters that encourages <100> growth and/or suppress the <110> growth; and where it is desirable to increase the lateral width without increasing the height, the epitaxial process may implement precursors and parameters that encourages <110> growth and/or suppress the <100> growth. Moreover, the silicon <111> facets each face along a direction that dissects an angle defined by the x-direction and the z-direction or an angle defined by the y-direction and the z-direction. In some embodiments, an angle between two interfacing <111> facets is about 45.0° to about 80.0°, and an angle between the <111> facet and the <100> facet is about 50.0° to about 70.0°.

Figure 6D:
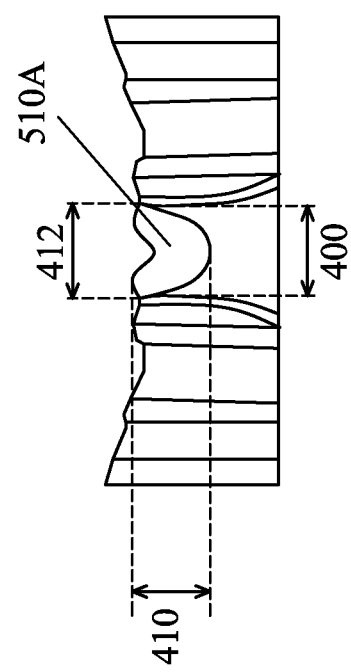
FIG. 6D, FIGS. 7D, 8D, 9D, and 12D are expanded diagrammatic cross-sectional views of a portion of the semiconductor device of FIG. 1 along the C-C line of FIG. 1, at various fabrication stages according to an embodiment of the present disclosure.

Referring to block 18 of FIG. 3 and to FIGS. 6A-6D, source/drain layers 510A are formed in the source/drain trenches 151 in an epitaxial process 600. The source/drain layers 510A is formed over and directly contacting the exposed surface of the fin structure 104 in the source/drain trenches 151 and between the fin sidewall spacers 204. In the depicted embodiments, the source/drain layer 510A each grows from the exposed side and bottom surfaces of the recessed fin structure 104 to fill or substantially fill the recesses 151a. In the depicted embodiments, the source/drain layers 510A each have a concave top surface. Meanwhile, referring to FIG. 6B, the epitaxial process terminates before growth fronts of the source/drain layers 510A on opposite sides of the source/drain trenches 151 meet and merge with each other along the x-direction. Referring to FIGS. 6B and 6D, the top surface of the source/drain layers 510A has a lateral width 412 along the y-direction. The lateral width 412 is about the same as the lateral width 400 of the fin structure 104. For example, the lateral width 412 may be about 1 nm to about 50 nm. Moreover, the source/drain layers 510A have a lower portion embedded within the fin structure 104. This source/drain layers 510A also has a height dimension 410 along the z-direction. In some embodiments, the height dimension 410 may be about 1 nm to about 10 nm. If the width dimension 412 is too small, such as less than the width 400 of the fin structure, or if height dimension 410 is too small, such as less than about 1 nm, the source/drain feature 500 may provide reduced amount of charge carriers during operation and unnecessarily limit the performance. Conversely, if the height dimension 410 is too large, such as greater than 10 nm, subsequent growth of another source/drain layer 510B may be interfered with such that ultimately formed source/drain features 500 may not have the optimal profile as designed. Moreover, the width dimension 412 is restricted by the fin sidewall spacers 204 and may not exceed the lateral width 400 of the fin structures 104.

Figure 7D:
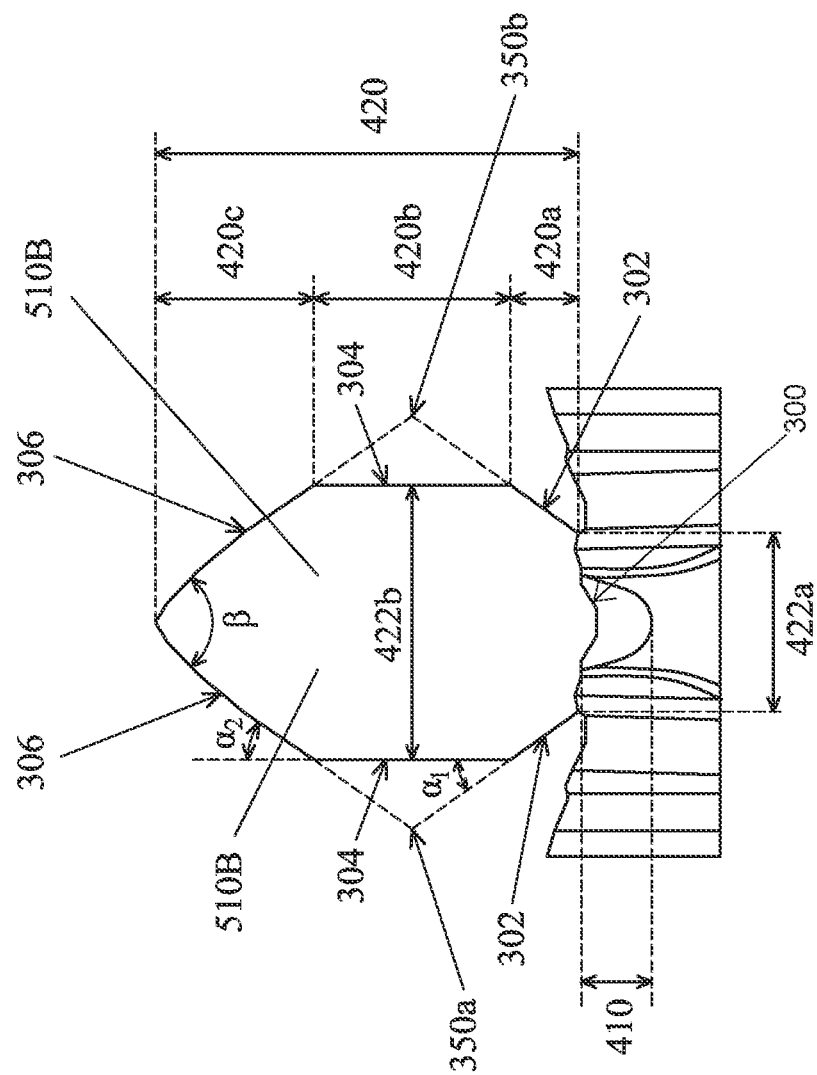

Referring to block 20 of FIG. 3 and to FIG. 7A-7D, the method proceeds to form source/drain layers 510B over the top surfaces of the source/drain layers 510A in an epitaxial process 620. The source/drain layers 510B extends upward along a z-direction above a top surface of the recessed fin structure 104. Moreover, the source/drain layers 510B extends laterally (such as along the y-direction) over the top surfaces of the fin sidewall spacers 204. For example, bottom portions of the source/drain layers 510B are formed on and directly contacting the top surface of the fin sidewall spacers 204. Because the source/drain layers 510B are above the top surfaces of the fin sidewall spacers 204, the only physical barriers that restricts the lateral growth of the source/drain layers 510B is the hybrid fins 231. Where hybrid fins 231 are absent next to the fin structure 104, such as illustrated in FIG. 7B, there are no immediate physical barriers that restrict the lateral growth of the source/drain layer 510B along the y-direction. Accordingly, the source/drain features 510B may further extend over adjacent fin structures 104. For example, in some embodiments (see FIGS. 1 and 2C), the source/drain layers 510B may be formed over (or "merges over") two or more adjacent recessed fin structures 104, as well as fin sidewall spacers 204 therebetween. Alternatively, the source/drain layers 510B may be formed over a single recessed fin structure 104. The present disclosure contemplates the source/drain layers 510B each being formed over any number of fin structures 104.

Referring to FIG. 7B, in some embodiments, the source/drain layers 510B has a profile that resembles a rectangle on the x-y cross-section (such as the B-B cross-section extending in parallel to the top surface of the substrate). For example, the source/drain layer 510B has two edges 320 interfacing with the fin structures 104 and extending substantially along the y-direction and two edges 322 that extend substantially along the x-direction. In some embodiments, the edges 322 are separated by a distance 422b. In other words, the source/drain layers 510B has a dimension 422b along the y-direction. In some embodiments, the dimension 422b is about 7 nm to about 84 nm, such as about 7 nm to about 20 nm. In some embodiments, a ratio of the dimension 422b to the width 400 of the fin structures 104 is about 12:1 to about 1:1, such as about 3:1 to about 1:1. As described later, the source/drain layers 510B forms the core of the source/drain features 500. If the dimension 422b is too small, or if the ratio is too small, the source/drain feature may be too small to provide the desired amount of charge carriers for optimal performance. Conversely, if the dimension 422b is too large, or if the ratio is too large, the device capacitance may undesirably increase. Because FIG. 7B illustrates a cross-section parallel to the top surface of the substrate 102, FIG. 7B may also be construed as illustrating the projection of the relevant features onto the top surface of the substrate 102, along the z-direction.

Referring to FIG. 7D, in some embodiments, the source/drain layers 510B has a profile that resembles a heptagon shape on the y-z cross-section (such as the C-C cross-section). For example, the heptagon of the source/drain layer 510B includes a bottom edge 300, two canted edges 302 connected to the bottom edge 300, two substantially vertical edges 304 connected to the canted edges 302, and two canted edges 306 connected to the edges 304 and connected to each other at a top vertex. The bottom edge 300 of the heptagon interfaces with the source/drain layers 510A and in the depicted embodiments also interfaces with the fin sidewall spacers 204. The bottom edge 300 has a lateral width 422a along the y-direction. In some embodiments, the lateral width 422a is about 7 nm to about 54 nm, such as about 7 nm to about 20 nm. The two canted sidewalls 302 each extend along a direction canted from the z-direction that is defined by the <111> facet of the silicon crystal. For example, the two canted sidewalls 302 each spans an angle α1 from the z-direction. In some embodiments, the angle α1 is about 30° to about 40°, such as about 34° to about 36°. In some instances, the angle α1 is about 35.3°. The two canted sidewalls 302 have a vertical height of 420a. In some embodiments, the vertical height 420a may be about 0.1 nm to about 21 nm, such as about 1 nm to about 10 nm. In some embodiments, the vertical height 420a may be zero. Moreover, the two substantially vertical edges 304 has a vertical height 420b along the z-direction. In some embodiments, the vertical height 420b may be about 21 nm to about 63 nm, such as about 35 nm to about 50 nm. In some embodiments, a ratio of the vertical height 420b to the vertical height 420a is greater than about 0.5:1, such as about 1:1 to about 8:1. In some embodiments, the ratio is about 1.5:1 to about 6:1. In some embodiments, the ratio is about 1.5:1 to about 3:1. If the ratio is too small, as described in more detail later, variations in the height of fin sidewall spacers 204 may assert significant impact on the lateral dimensions of the source/drain layers 510B, and ultimately on the critical dimension of the source/drain features. The two canted sidewalls 306 each spans an angle α2 from the z-direction, that is similarly defined by the <111> facet of the silicon crystal. In some embodiments, the angle α2 is about 30° to about 40°, such as about 34° to about 36°. In some instances, the angle α2 is about 35.3°. The canted sidewalls 306 each have a vertical height 420c. In some embodiments, the vertical height 420c may be about 0.1 nm to about 21 nm, such as about 1 nm to about 10 nm. In some embodiments, a ratio of the vertical height 420c to the vertical height 420b is about 2:1 to about 0.01:1. In some embodiments, the ratio is about 1:1 to about 0.25:1. If the ratio is too small, there may not be sufficient height to the source/drain layers 510B which largely determines the height of the source/drain features 500. Conversely, if the ratio is too large, the landing platform of the subsequently formed contact feature on the source/drain features may be too small. The two canted sidewalls 306 spans an angle β from each other. In some embodiments, the angle β may be about 35° to about 180°, such as about 60° to about 120°, which is substantially determined by the crystal planes of silicon. In other embodiments, the epitaxial materials may be germanium, silicon germanium and/or other semiconductor materials. Accordingly, the angles α1, α2, and β may have alternative values determined by crystallographic properties of the alternative epitaxial materials.

The two substantially vertical sidewalls 304 defines a lateral width 422b of the source/drain layers 510B. As described above with respect to FIG. 7B, the lateral width 422b may be about 7 nm to about 54 nm, such as about 20 nm to about 40 nm. The sum of the vertical heights 420a, 420b, and 420c, or the vertical height 420 of the source/drain layers 510B, is about 40 nm to about 200 nm, such as about 60 nm to about 80 nm. In some embodiments, as described later, the source/drain layer 510B forms a core of the source/drain feature 500 which is later fine-tuned with additional source/drain layers formed thereon. In such embodiments, the vertical height 420 largely determines the vertical height of the source/drain feature 500. For example, the vertical height 420 accounts for at least 70% of the vertical height of the source/drain feature 500. In other embodiments, the vertical height 420 accounts for at least 20% of the vertical height of the source/drain feature 500. If the vertical height 420 is too small, the source/drain feature 500 may be too small to provide sufficient amount of charge carriers to satisfy the desired performance level during operation, and/or that the benefit profile described herein may not be reliably formed; if the vertical height 420 is too large, the extra size may not bring sufficient benefit to justify its chip footprint. In some embodiments, a ratio of the lateral width 422b to the vertical height 420 is about 1:1 to about 1:10, such as about 1:1.5 to about 1:4. If the ratio is too small or too large, the desired profile for the source/drain features may not satisfactorily form and the control to the critical dimension desired herein may not be maximized.

As described above, the growth of crystalline silicon is anisotropic and proceeds primarily by the advancements of the growth fronts along the <100>, <110>, and <111> facets. Accordingly, given sufficient time, the profile of the source/drain layers 510B may approach a profile that resembles a diamond (rhombic) shape with the bottom corner truncated (such as the profile represented by the dotted lines of FIG. 7D). As compared to the heptagon profile described herein, a source/drain layer of the truncated diamond profile is more sensitive to perturbing factors such as the variation in location and height of the fin spacer sidewalls. Minor variations may lead to substantial variation in feature critical dimensions.

For example, in some approaches not implementing methods of the present disclosure, the source/drain layers 510B may grow further as illustrated in FIG. 7D and into a profile of a truncated diamond profile that has two vertices 350a and 350b. In one situation, the vertices 350a and 350b are aligned along the y-direction; in other words, they are at the same height level along the z-direction. Accordingly, the distance between the vertices 350a and 350b defines the lateral width of the source/drain layer 510B, which in turn determines the lateral width of the source/drain feature 500. However, as the growth of the <111> facets proceed (such as by the advancement of the edge 302), the edge 302 will interface with the fin sidewall spacers 204. In such situations, the top surface of the fin sidewall spacers 204 determines the starting height level for the edge 302 and eventually determines the position of the vertices 350a and 350b. As described above, the height of the fin sidewall spacers 204 are subject to relatively significant variations. Therefore, any variation in the height of the fin sidewall spacer 204 on one side of the fin structure 104 relative to that on the other side of the fin structure 104 will lead to different height of the vertex 350a relative to the vertex 350b. In such situations, the lateral width of the source/drain layer 510B is no longer solely defined by the separation of the vertices along the y-direction, but also affected, sometimes sensitively, by the vertical separations of the vertices. In other words, the same epitaxy growth process 620 may lead to different lateral widths depending on the evenness or unevenness of the fin sidewall spacers 204 on both sides of the fin structures 104. This introduces significant variations in the critical dimensions. In other words, control over the uniformity of the critical dimension is compromised. By contrast, a source/drain layer 510B of the heptagon profile, as provided herein, has a lateral width defined by lateral separations of two relatively long vertical edges 304 (rather than two vertices). Accordingly, even with variations in the heights of the fin sidewall spacers 204 and consequently relative positions of one edge 304 to the other edge 304, the lateral separations between these two edges 304 remain constant. This removes the variation in critical dimension caused by factors such as the fin sidewall spacers 204 and improves uniformity.

The above-described profile of the source/drain layer 510B is achieved by adjusting the conditions of the epitaxial growth process 620. The epitaxial growth process 620 implements the general growth condition described above.

In some embodiments, the epitaxial growth process implements silane ($SiH_4$) as the precursor. In some embodiments, silane as the precursor promotes the growth rate of the <100> facet as compared to the <110> facet. Accordingly, higher aspect ratios (such as that required by the heptagon profile) may be more readily achieved. For example, the growth rate of the <100> facet may be substantially greater than the growth rate of the <110> facet. In some embodiments, a ratio of the growth rate of the facet <100> to the growth rate of the facet <110> may be about 1.1:1 to about 10:1, such as about 1.5:1 to about 4:1. In some embodiments, the epitaxial growth of the source/drain layers 510A has a time duration t1, and the epitaxial growth of the source/drain layers 510B has a time duration t2. For example, a ratio of t2 to the time duration t1 is about 5:1 to about 50:1, such as about 7:1 to about 30:1. If the time duration t2 is too large, or if the ratio of t2 to t1 is too large, the lateral growth of the source/drain layers 510B may be too much such that vertices are formed (such as vertices 350a and/or 350b) are formed. If the time duration t2 is too small, or if the ratio of t2 to t1 is too small, the height of the source/drain layer 510B may be too small. For subsequently formed source/drain layers (such as the source/drain layers 510C) to substantially increase this height, the profile of the source/drain layers 510C designed to reduce capacitances, as described below, may not be satisfactorily achieved. Accordingly, the overall optimal performance of the device may not be achieved.

Figure 8D:
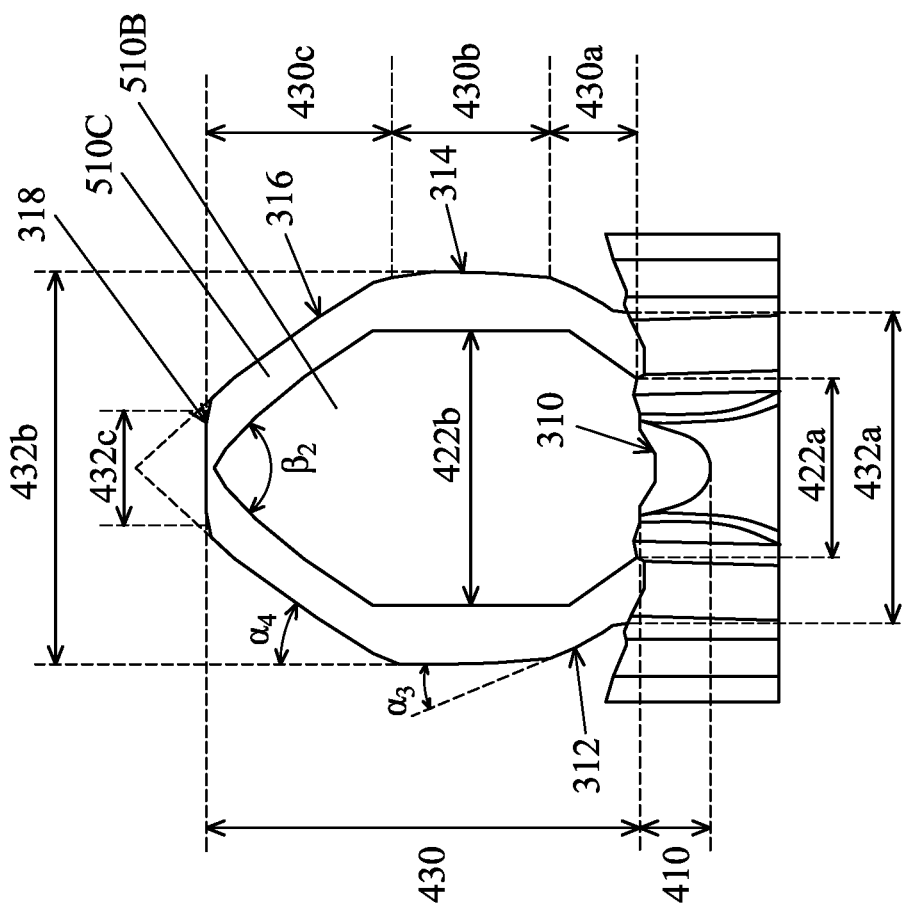
Figure 9D:
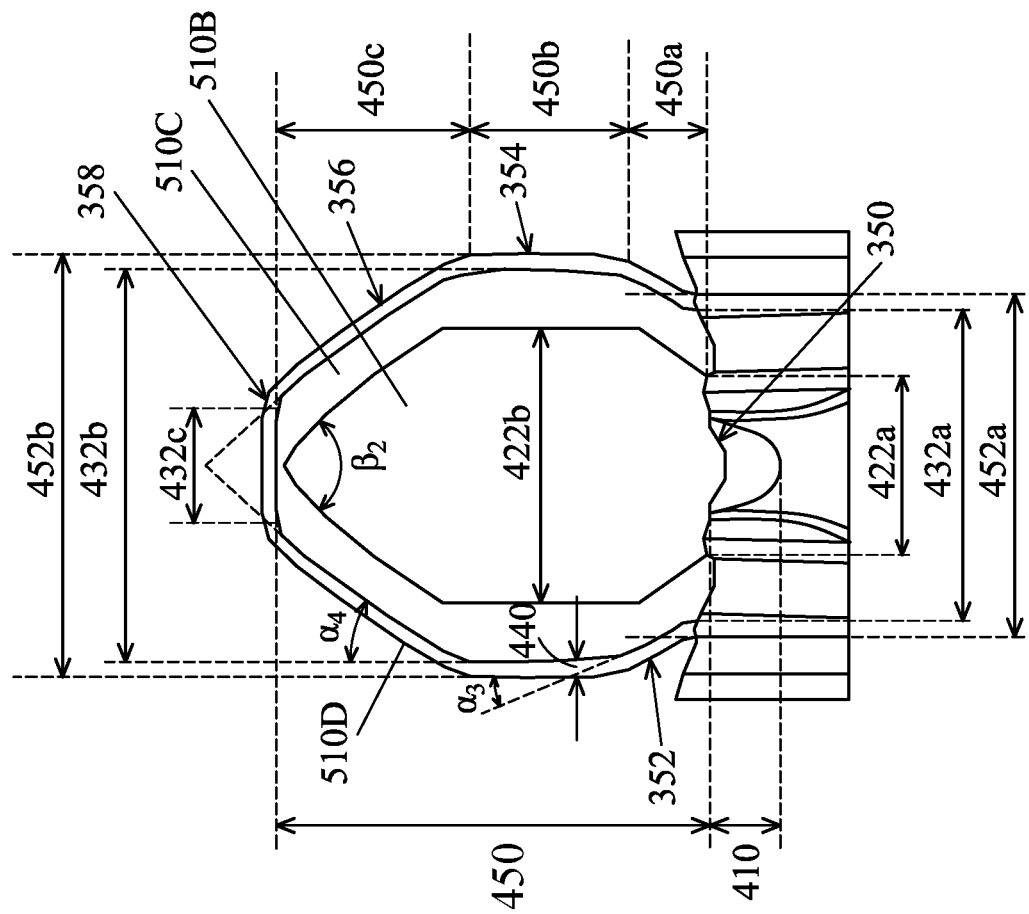

Referring to block 22 of FIG. 3 and to FIGS. 8A-8D, a source/drain layer 510C is formed over the top and sidewall surfaces of the source/drain layer 510B. Referring to FIG. 8B, the source/drain layer 510C may have a profile that resembles a hexagon. For example, the source/drain layer 510C has two edges 330 interfacing with the fin structures 104 and extending substantially along the y-direction, two edges 332 that spans an angle γ1 from the y-direction; and two edges 334 that spans an angle γ2 from the y-direction. Moreover, the two edges 332 spans an angle δ1 from each other at a vertex V1; and the two edges 334 spans an angle δ2 from each other at a vertex V2. A line connecting the vertices V1 and V2 is a diagonal of the hexagon, which dissects the angles δ1 and δ2. In some embodiments, the angles γ1 and γ2 may be about 30° to about 60°, such as about 35° to about 55°; and the angles δ1 and δ2 may be about 60° to about 120°, about 70° to about 110°. In some embodiments, the angles γ1, γ2, δ1, and δ2 are determined by the crystallographic properties of the epitaxial material, here, silicon. Because FIG. 8B illustrates a cross-section parallel to the top surface of the substrate 102, FIG. 8B may also be construed as illustrating the projection of the relevant features onto the top surface of the substrate 102, along the z-direction.

Referring to FIG. 8D, in some embodiments, the source/drain layer 510C has a profile that resembles an octagon (or a heptagon with the top corner truncated) on the C-C cross-section in the y-z plane. For example, referring to FIG. 8D, the source/drain layers 510C has a bottom edge 310, two canted edges 312, two substantially vertical edges 314, two canted edges 316, and a substantially horizontal edge 318 (along the y-direction). The edges 312 each span an angle α3 from the z-direction; the edges 316 each span an angle α4 from the z-direction. In some embodiments, the angles α3 and α4 is substantially similar to the angels α1 and α2, respectively. Moreover, the edges 312 each has a vertical height 430a, the edges 314 each has a vertical height 430b, the edges 316 each has a vertical height 430c. In some embodiments, the vertical height 430a is about 0 nm to about 25 nm, such as about 1 nm to about 15 nm; the vertical height 430b is about 11 nm to about 63 nm; and the vertical height 430c is about 0 nm to about 25 nm, such as about 1 nm to about 15 nm. In some embodiments, a ratio of the vertical height 430b to the vertical 430a is about 0.4:1 to about 200:1, such as about 2:1 to about 10:1. In some embodiments, a ratio of the vertical height 430b to the vertical height 430c is about 0.4:1 to about 200:1, such as about 2:1 to about 10:1. In some embodiments, the bottom edge 310 has a lateral dimension 432a along the y-direction; the two opposing edges 314 define the lateral width 432b of the source/drain layer 510B; and the top edge 318 has a lateral dimension 432c along the y-direction. In some embodiments, a ratio of the lateral dimension 432c to the lateral dimension 432a is about 0.5:1 to about 1:1. If the ratio is too small, such as less than about 0.5:1, the top surface of the source/drain features formed therefrom may not have a sufficiently sized landing plateau for the local contact features formed thereon, as described above. If the ratio is too large, such as greater than about 1:1, the device capacitance may be adversely affected. In some embodiments, the source/drain layer 510C has a vertical height 430 that equals to the sum of the vertical heights 430a, 430b, and 430c. In some embodiments, a ratio of the vertical height 430 to the lateral width 432b is about 1.5:1 to about 2:1. Furthermore, a projection of the octagon onto the B-B plane (such as the B-B plane illustrated in the FIG. 8B) forms a diagonal that dissects the hexagon of FIG. 8B. For example, the projections of the edges 314 onto a B-B plane defines the two ends of the diagonal, which is also two vertices of the hexagon.

In some embodiments, the above-described profile of the source/drain layer 510C is achieved by selecting proper precursors and epitaxy process parameters. For example, the source/drain layer 510C may be formed from the epitaxial process 640. The epitaxial process 640 implements conditions similar to those described above. In some embodiments, however, the process 640 utilizes a silicon precursor that is different from the silicon precursor used for the epitaxial process 620. As described above, in the depicted embodiments, the process 620 implements $SiH_4$. By contrast, the epitaxial process 640 implements a halogen-containing precursor. For example, the epitaxial process 640 may implement dichlorosilane ($SiH_2Cl_2$). In some embodiments, halogen-containing precursors suppress the silicon growth of the <100> facets relative to the <110> facets. Accordingly, the lateral width 432b along the y-direction substantially increases as compared to the lateral width 422b; while the height 430 is only slightly increased from the height 420 of the epitaxial source/drain layer 510B. In some embodiments, the growth along the y-direction may be represented by a difference Δ1 between the lateral width 432b and the lateral width 422b; while the growth along the z-direction may be represented by a difference Δ2 between the height 430 and the height 420. In some embodiments, a ratio of the difference Δ1 to the difference Δ2 is greater than about 0.1:1. If the ratio is too small, such as less than 0.1:1, the further growth of the <100> facets may form a vertex similar to that of the source/drain layers 510B. Accordingly, the source/drain features 500 formed therefrom do not have a flat top surface. This reduces the contact surface area with subsequently formed local contact features, such that the contact resistance is not optimized.

Referring to block 24 of FIG. 3 and to FIGS. 9A-9D, a source/drain layer 510D is formed in an epitaxial process 660 to wrap around the source/drain layers 510C. At this processing stage, the source/drain layers 510A-510D collectively form the source/drain features 500. Moreover, the profile and dimensions of the source/drain layer 510D determines the profile and dimensions of the source/drain feature 500. In some embodiments, the source/drain layer 510D is a conformal layer. Accordingly, the source/drain layer 510D does not alter the profile of the source/drain feature 500. For example, the source/drain layer 510D (and consequently the source/drain feature 500) has a bottom edge 350, two canted edges 352, two substantially vertical edges 354, two canted edges 356, and a horizontal edge 358. The directions and angles of these edges 350, 352, 354, 356, and 358 relative to the z-direction substantially equal to the directions and angles of the edges 310, 312, 314, 316, and 318 of the source/drain layers 510B. Moreover, the bottom edge 350 has a lateral dimension 452a, the substantially vertical edges 354 define a lateral width 452b of the source/drain layer 510D, the top edge 358 has a lateral width 452c. Furthermore, the edges 352, 354, 356 each have a vertical height 450a, 450b, and 450c. The ratios of vertical heights 450a, 450b, and 450c relative to each other, the ratios of the lateral widths 452a, 452b, and 452c relative to each other, and the ratio of the vertical height 450 relative to the lateral width 452b are each substantially same as the ratios of the vertical heights 430a, 430b, and 430c of the source/drain layers 510C, the ratios of the lateral widths 432a, 432b, and 432c relative to each other, and the ratio of the vertical height 430 relative to the lateral width 432b. In some embodiments, the source/drain layer 510D has a thickness 440 of about 1 nm to about 5 nm. The source/drain features 500 has a lateral width 452b along the y-direction of about 16 nm to about 70 nm; and a height 450 of about 11 nm to about 90 nm.

The source/drain layer 510D protects the inner source/drain layers from subsequent processing. The source/drain layer 510D may implement similar epitaxial processes described above. In some embodiments, the source/drain layer 510D may include silicon and may further include phosphorous as the dopant. In some embodiments, the source/drain layers 510A, 510B, 510C and/or 510D may be undoped during the formation processes. Rather, the source and drain features may be doped in a subsequent process, for example, by an ion implantation process, plasma immersion ion implantation (PIII) process, gas and/or solid source diffusion process, other suitable process, or combinations thereof. In some embodiments, the source/drain layers 510A, 510B, 510C, and/or 510D may further be exposed to annealing processes, such as a rapid thermal annealing process.

Referring to block 26 of FIG. 3 and to FIGS. 10A-10C, the method proceeds to form an inter-level dielectric (ILD) layer 230 over the source/drain features 500 and over the gate structures. The ILD layer 230 may include any suitable materials, such as silicon carbonitride (SiCN), silicon oxycarbonitride (SiOCN), silicon oxynitride (SiON), metal oxides, other suitable materials, or combinations thereof. Further, a contact etch stop layer (CESL) may be formed on top of the gate structures before forming the ILD layer. Referring to block 28 of FIG. 3 and to FIGS. 11A-11C, a chemical mechanical polishing (CMP) process is further applied to the substrate to planarize the top surfaces of the ILD layer, and in some embodiments, to expose the top surfaces of the gate structure. In some embodiments, a gate replacement process is conducted at this processing stage to form a HKMG gate structure. In some embodiments, a gate replacement process is conducted to form a high-k metal gate electrode.

Figure 12D:
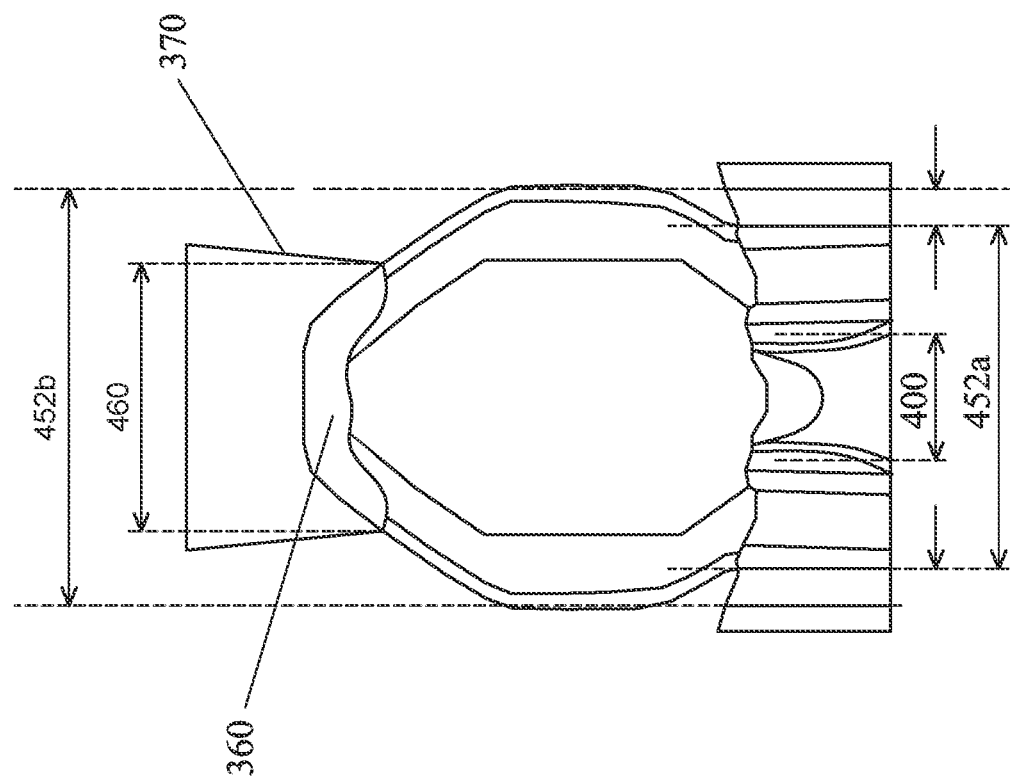

Referring to block 30 of FIG. 3 and to FIGS. 12A-12C, contact trenches are formed in the ILD layers 230. The contact trenches may be formed by any suitable etching processes such as a dry etching, a wet etching, or combinations thereof. The contact trenches expose the top surface of the source/drain features 500. Moreover, a metal layer is deposited into the contact trenches and to directly interface with the source/drain features 500. The metal layer may be Ti, Co, Ta, W, or Mo, or a compound thereof. In some embodiments, the metal layer may be Ti and be about 10 Å to about 100 Å thick. In some embodiments, the metal layer may be formed by atomic layer deposition (ALD), or any other suitable deposition process. Subsequently, the device 100 is subjected to an annealing operation, for example, a rapid thermal anneal (RTA) step, to achieve silicidation by reaction of metal layer with the underlying epitaxial source/drain feature 500. In some embodiments, the annealing operation includes more than one annealing steps. The annealing step that forms a silicide layer 360 from top portions of the source/drain features 500 and the metal layer. In the depicted embodiments, the portions of the source/drain layers 510B, 510C, and 510D are partially consumed to form the silicide layer. In other embodiments, however, the source/drain layers 510B may not be consumed in the silicide reactions. In some embodiments, the extent of the silicidation reaction may be controlled by a temperature and a time duration of the reaction. For example, the annealing reaction may be conducted for a time duration of about 10 seconds to about 180 seconds, at a temperature of about 300° C. to about 500° C. In some embodiments, the annealing reaction is conducted in an atmosphere of $N_2$, He, or in a vacuum. The annealing step may be performed in a furnace, by rapid thermal anneal (RTA), in a physical vapor deposition (PVD) chamber, or on a hot plate. As illustrated in FIG. 12D, the silicide layer 360 may have a lateral width 460 along the y-direction. In some embodiment, the lateral width 460 may be about 3 nm to about 15 nm. In some embodiment, a ratio of the lateral width 460 to the lateral width 452b of the source/drain feature 500 may be about 0.075:1 to about 0.75:1. As described above, the source/drain features 500 obtained using the methods described in the present disclosure has a greater top surface area as compared to source/drain features obtained using some other approaches. Accordingly, the contact surface area with the metal layer, and consequently the surface area of the silicide features 360 is increased, and contact resistances thereof is reduced. In some embodiments, the deposited metal layer fills the contact trenches, and serves as the local contact feature 370. In some other embodiments, the deposited metal layer does not fill the contact trench. Rather, an additional bulk metal layer is subsequently deposited into the contact trenches and over the silicide layer 360 to form the local contact feature 370.

Although the disclosure above describes n-type source/drain features for n-type devices (or nMOS). A person of ordinary skills in the art may recognize that similar approaches may be applicable to forming p-type source/drain features for p-type devices (or pMOS). Moreover, a CMOS device may have one or both device components implementing the methods and structures described herein. Furthermore, although the disclosure uses FinFET as an example, a person of ordinary skills in the art may recognize that similar approaches may be applicable to planar MOS, multi-gate MOS (including gate-all-around devices, multi-bridged channel devices, etc.) and/or other similar devices.

The various embodiments described herein offer several advantages over the existing art. It will be understood that not all advantages have been necessarily discussed herein, no particular advantage is required for all embodiments, and other embodiments may offer different advantages. For example, embodiments discussed herein include methods of forming an epitaxial source/drain structure. As compared to other approaches, the source/drain features provided herein may have a larger top surface area for forming a silicide feature of larger surface area. Accordingly, the contact resistances with local contact features are reduced. Moreover, as compared to other approaches, because the source/drain features have substantially vertical sidewall surfaces along the y-direction, the lateral width and critical dimension of the source/drain features are less sensitive to the height and/or locations of the fin sidewall spacers. As a result, the uniformity control over critical dimension is improved. Furthermore, as compared to other approaches, the methods and structures provided herein enable the device has reduced capacitance and improved overall device performances.

In one example aspect, the present disclosure is directed to a device. The device includes an active region on a semiconductor substrate. The active region extends along a first direction. The device also includes a gate structure on the active region. The gate structure extends along a second direction that is perpendicular to the first direction. Moreover, the gate structure engages with a channel on the active region. The device further includes a source/drain feature on the active region and connected to the channel. A projection of the source/drain feature onto the semiconductor substrate resembles a hexagon.

In some embodiments, the hexagon has two edges each spanning an angle of about 30° to about 60° from the second direction. In some embodiments, a cross section of the source/drain feature along a plane perpendicular to the first direction has a first edge and a second edge. A projection of the first edge defines a first vertex of the hexagon; a projection of the second edge defines a second vertex of the hexagon. The first vertex and the second vertex are on two ends of a diagonal, and the diagonal extends along the second direction. In some embodiments, a cross-section of the source/drain feature along a plane perpendicular to the first direction has a profile that resembles an octagon. In some embodiments, the cross-section of the source/drain feature has a first edge and a second edge. The first and the second edges each extend substantially along a vertical direction perpendicular to a top surface of the substrate. In some embodiments, the cross-section of the source/drain feature has a third edge that interfaces with a dielectric feature on a sidewall of the active region and connected to the first edge. The first edge has a first height along the vertical direction. The third edge has a second height along the vertical direction. And a ratio of the first height and the second height is about 1:1 to about 8:1. In some embodiments, the device further includes a silicide layer on the source/drain feature. The cross-section of the source/drain feature has a fourth edge connected to the first edge and interfacing with the silicide layer. The first edge has a first height along the vertical direction. The fourth edge has a third height along the vertical direction. And a ratio of the third height to the first height is about 0.25:1 to about 1:1. In some embodiments, the device further includes a stack of semiconductor layers on the active region and engaged by the gate structure. The stack of semiconductor layers connect to the source/drain feature.

In one example aspect, the present disclosure is directed to a device. The device includes a semiconductor substrate, an active region on the semiconductor substrate and a source/drain feature. The active region extends along a first direction. The source/drain feature is on the active region and extends in a first plane parallel to a top surface of the semiconductor substrate. Moreover, the source/drain feature also extends in a second plane perpendicular to the first direction. Furthermore, a first cross-section of the source/drain feature along the first plane has a profile that resembles a hexagon, and a second cross-section of the source/drain feature along the second plane has a profile that resembles an octagon.

In some embodiments, the first cross-section has two corners facing away from the active region and aligned along a second direction perpendicular to the first direction. In some embodiments, the first cross-section includes first edge and a second edge that collectively define a corner of the two corners. Moreover, an angle defined by the first edge and the second edge is about 70° to about 110°. In some embodiments, the second cross-section has a third edge. The third edge extends substantially parallel to a third direction perpendicular to the top surface of the semiconductor substrate. In some embodiments, the second cross-section has a fourth edge between the third edge and the semiconductor substrate. The third edge has a first edge height along the third direction, the fourth edge has a second edge height along the third direction, and a ratio of the first edge height to the second edge height is about 1:1 to about 8:1.

In one example aspect, the present disclosure is directed to a method. The method includes receiving a workpiece that has an active region over a semiconductor substrate and a gate structure over the active region. The method also includes recessing the active region to form source/drain trenches. The method further includes forming a first source/drain layer over the active region in the source/drain trenches from a first precursor. Additionally, the method includes forming a second source/drain layer over the first source/drain layer from a second precursor, where the second precursor being different from the first precursor.

In some embodiments, the second source/drain feature includes crystalline silicon, and the second precursor is dichlorosilane (SiH$_2$Cl$_2$). In some embodiments, the first source/drain feature includes crystalline silicon, and the first precursor is silane (SiH$_4$). In some embodiments, the method further includes, prior to the forming of the first source/drain layer and the second source/drain layer, forming another source/drain layer on the active region. Moreover, the forming of the another source/drain layer includes conducting a first deposition for a first time duration; the forming of the first source/drain layer includes conducting a second deposition for a second time duration, where a ratio of the first time duration to the second time duration is about 5:1 to about 50:1. In some embodiments, the forming of the first source/drain layer includes promoting a growth rate of a <100> facet of the first source/drain layer as compared to a <110> facet of the first source/drain layer. In some embodiments, the forming of the second source/drain layer includes suppressing a growth rate of a <100> facet of the second source/drain layer relative to a <110> facet of the second source/drain layer. In some embodiments, the method further includes forming a silicide layer over and directly contacting the first epitaxial layer, and over and directly contacting the second epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
an active region on a semiconductor substrate extending along a first direction;
a gate structure on the active region extending along a second direction perpendicular to the first direction, the gate structure engaging with a channel on the active region;
a source/drain feature on the active region and connected to the channel; and
a silicide layer on the source/drain feature,
wherein a projection of the source/drain feature onto the semiconductor substrate resembles a hexagon,
wherein a cross-section of the source/drain feature along a plane perpendicular to the first direction has a profile that resembles an octagon and comprises:
a first sidewall and a second sidewall each extending substantially along a vertical direction perpendicular to a top surface of the semiconductor substrate, and
a third sidewall connected to the first sidewall and interfacing with the silicide layer, wherein the first sidewall has a first height along the vertical direction, the third sidewall has a second height along the vertical direction, and a ratio of the first height and the second height is about 0.25:1 to about 1:1, and
wherein the source/drain feature comprises a first semiconductor layer embedded in the active region and comprising a concave top surface.

2. The device of claim 1, wherein the hexagon has two edges each spanning an angle of about 30° to about 60° from the second direction.

3. The device of claim 1, wherein the cross-section of the source/drain feature has a first edge and a second edge, and wherein a projection of the first edge defines a first vertex of the hexagon, a projection of the second edge defines a second vertex of the hexagon, and the first vertex and the second vertex are on two ends of a diagonal, the diagonal extending along the second direction.

4. The device of claim 1, wherein the cross-section of the source/drain feature has a fourth sidewall interfacing with a dielectric feature on a sidewall of the active region and connected to the first sidewall, wherein a ratio of the first height to a height of the fourth sidewall along the vertical direction is about 1:1 to about 8:1.

5. The device of claim 1, further comprising a stack of semiconductor layers on the active region and engaged by the gate structure, wherein the stack of semiconductor layers connect to the source/drain feature.

6. The device of claim 1, wherein the source/drain feature further comprises a second semiconductor layer over and in direct contact with the first semiconductor layer, wherein the second semiconductor layer comprises two substantially vertical sidewalls.

7. A device, comprising:
a semiconductor substrate;
an active region on the semiconductor substrate extending along a first direction;
a source/drain feature on the active region and extending in a first plane parallel to a top surface of the semiconductor substrate, and in a second plane perpendicular to the first direction,
wherein a first cross-section of the source/drain feature along the first plane has a profile that resembles a hexagon, and a second cross-section of the source/drain feature along the second plane has a profile that resembles an octagon,
wherein, the second cross-section of the source/drain feature comprises a first semiconductor layer including two substantially vertical edges and a second semiconductor layer on and extending along the two substantially vertical edges of the first semiconductor layer, and wherein, a shape of the second semiconductor layer in the second cross-section resembles an octagon and is different from a shape of the first semiconductor layer in the second cross-section.

8. The device of claim 7, wherein the first cross-section has two corners facing away from the active region and aligned along a second direction perpendicular to the first direction.

9. The device of claim 8, wherein the first cross-section includes a first edge and a second edge that collectively define a corner of the two corners, and
wherein an angle defined by the first edge and the second edge is about 70° to about 110°.

10. The device of claim 7, wherein the second cross-section has a third edge extending substantially parallel to a third direction perpendicular to the top surface of the semiconductor substrate.

11. The device of claim 10, wherein the second cross-section has a fourth edge between the third edge and the semiconductor substrate,
wherein the third edge has a first edge height along the third direction, the fourth edge has a second edge height along the third direction, and a ratio of the first edge height to the second edge height is about 1:1 to about 8:1.

12. The device of claim 7, wherein the second semiconductor layer comprises two substantially vertical edges.

13. The device of claim 12, wherein, the second cross-section of the source/drain feature comprises a third semiconductor layer disposed directly on and extending along the two substantially vertical edges of the second semiconductor layer.

14. The device of claim 13, wherein, a shape of the third semiconductor layer in the second cross-section resembles an octagon.

15. A semiconductor device, comprising:
a gate structure engaging a semiconductor fin; and
a source/drain feature formed in and over the semiconductor fin and adjacent the gate structure;
wherein, in a cross-sectional view cut through the source/drain feature without cutting through the gate structure, the source/drain feature comprises:
a first semiconductor layer embedded in the semiconductor fin,
a second semiconductor layer disposed over and in direct contact with a top surface of the first semiconductor layer, wherein a shape of the second semiconductor layer resembles an octagon and comprises two substantially vertical sidewalls,
a third semiconductor layer wrapping around the second semiconductor layer, and
a fourth semiconductor layer wrapping around the third semiconductor layer.

16. The semiconductor device of claim 15, further comprising:
a fin sidewall spacer adjacent a bottom portion of a sidewall surface of the source/drain feature,
wherein the third semiconductor layer is in direct contact with a top surface of the fin sidewall spacer.

17. The semiconductor device of claim 15, wherein, in a top view, a shape of the third semiconductor layer resembles a hexagon.

18. The semiconductor device of claim 15, further comprising:
a silicide layer over and in direct contact with a top surface of the source/drain feature,
wherein the silicide layer is in direct contact with the second semiconductor layer, the third semiconductor layer, and the fourth semiconductor layer.

19. The semiconductor device of claim 15, wherein the third semiconductor layer comprises two substantially vertical sidewalls adjacent the two substantially vertical sidewalls of the second semiconductor layer.

20. The semiconductor device of claim 15, wherein the fourth semiconductor layer comprises a uniform thickness.

* * * * *